US010551219B2

(12) United States Patent
Kondo

(10) Patent No.: US 10,551,219 B2
(45) Date of Patent: Feb. 4, 2020

(54) ELECTROSTATIC ENCODER

(71) Applicant: ORIENTAL MOTOR CO. LTD., Tokyo (JP)

(72) Inventor: Daiki Kondo, Ibaraki (JP)

(73) Assignee: ORIENTAL MOTOR CO. LTD., Tokyo (JP)

(*) Notice: Subject to any disclaimer, the term of this patent is extended or adjusted under 35 U.S.C. 154(b) by 247 days.

(21) Appl. No.: 15/536,357

(22) PCT Filed: Dec. 4, 2015

(86) PCT No.: PCT/JP2015/084130
§ 371 (c)(1),
(2) Date: Jun. 15, 2017

(87) PCT Pub. No.: WO2016/098613
PCT Pub. Date: Jun. 23, 2016

(65) Prior Publication Data
US 2017/0350731 A1 Dec. 7, 2017

(30) Foreign Application Priority Data
Dec. 17, 2014 (JP) ................. 2014-255350

(51) Int. Cl.
G01R 27/26 (2006.01)
G01D 5/241 (2006.01)
(Continued)

(52) U.S. Cl.
CPC .......... *G01D 5/2415* (2013.01); *G01D 5/245* (2013.01); *G01R 21/12* (2013.01); *G01R 27/02* (2013.01);
(Continued)

(58) Field of Classification Search
CPC .... G01R 27/2605; G01R 27/02; G01R 21/12; G01R 35/00; G01R 27/14; G01R 31/2648; G01R 31/2837; G01R 3/00
(Continued)

(56) References Cited

U.S. PATENT DOCUMENTS 4,429,307 A 1/1984 Fortescue
4,477,860 A 10/1984 Wason et al.
(Continued)

FOREIGN PATENT DOCUMENTS

CN 1347493 5/2002
CN 101750105 6/2010
(Continued)

OTHER PUBLICATIONS

The International Report on Patentability (Chapter 1) from the corresponding PCT/JP15/084130 and English translation of same dated Jun. 29, 2017.
(Continued)

Primary Examiner — Raul J Rios Russo
(74) Attorney, Agent, or Firm — Bryan Cave Leighton Paisner LLP

(57) ABSTRACT

An electrostatic encoder (40) detects the rotation angle of a rotor (42) with great accuracy based on the change in the capacitance between electrodes arranged on a stator (41) and the rotor (42). Detection electrodes (44a to 44d) and transmission electrodes (45a to 45d) are arranged circumferentially and alternately on the stator (41). Detection signals (phase A, phase B) amplitude-modulated based on the rotation of the rotor (42) and having a mutual phase difference of 90 degrees are output from adjacent ones of the detection electrodes. Modulated signals (V1, V2) are generated by demodulating the detection signals having a mutual phase difference of 90 degrees. Applying resolver-
(Continued)

digital (RD) conversion processing to the modulated signals allows obtaining the rotation angle of the rotor.

9 Claims, 14 Drawing Sheets

(51) Int. Cl.
*G01D 5/245* (2006.01)
*G01R 35/00* (2006.01)
*G01R 27/14* (2006.01)
*G01R 27/02* (2006.01)
*G01R 21/12* (2006.01)
*G01R 31/26* (2020.01)
*G01R 31/28* (2006.01)
*G01R 3/00* (2006.01)

(52) U.S. Cl.
CPC ......... *G01R 27/14* (2013.01); *G01R 27/2605* (2013.01); *G01R 31/2648* (2013.01); *G01R 35/00* (2013.01); *G01R 3/00* (2013.01); *G01R 31/2837* (2013.01)

(58) Field of Classification Search
USPC ... 324/76.11–76.83, 459, 600, 649, 658, 661
See application file for complete search history.

(56) References Cited

U.S. PATENT DOCUMENTS

| | | |
|---|---|---|
| 5,896,032 A | 4/1999 | Yagi et al. |
| 6,492,911 B1 | 12/2002 | Netzer |
| 2001/0005139 A1 | 6/2001 | Adachi et al. |
| 2003/0222660 A1* | 12/2003 | Morimoto ............... G01L 1/142 324/661 |
| 2004/0244183 A1* | 12/2004 | Hodgins ............ G01C 19/5684 29/593 |
| 2005/0179445 A1* | 8/2005 | Nakano ................ H03K 17/955 324/661 |
| 2010/0045489 A1* | 2/2010 | Gondo .................. G01D 5/2415 341/15 |
| 2010/0148801 A1* | 6/2010 | Uchida ................ G01D 5/2415 324/660 |
| 2010/0148802 A1 | 6/2010 | Uchida et al. |
| 2012/0278033 A1 | 11/2012 | Bucher et al. |

FOREIGN PATENT DOCUMENTS

| | | |
|---|---|---|
| CN | 102713526 | 10/2012 |
| CN | 103017803 | 4/2013 |
| EP | 0435429 | 7/1991 |
| EP | 0714171 | 5/1996 |
| GB | 2133889 | 8/1984 |
| JP | H09005111 | 1/1997 |
| JP | 2005061964 | 3/2005 |
| JP | 2010164553 | 7/2010 |
| KR | 1020090109854 | 10/2009 |
| TW | 573116 | 1/2004 |

OTHER PUBLICATIONS

The International Search Report and Written Opinion from corresponding PCT/JP15/084130 and English translation of the International Search Report dated Jan. 26, 2016.

* cited by examiner

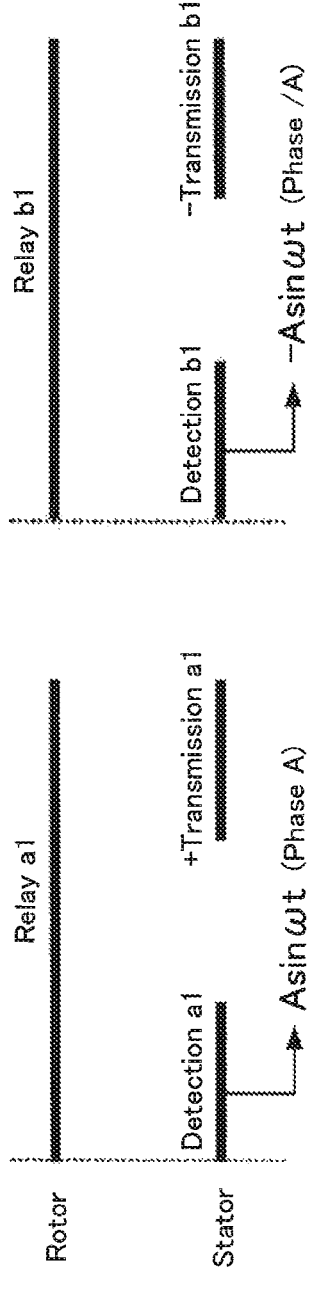
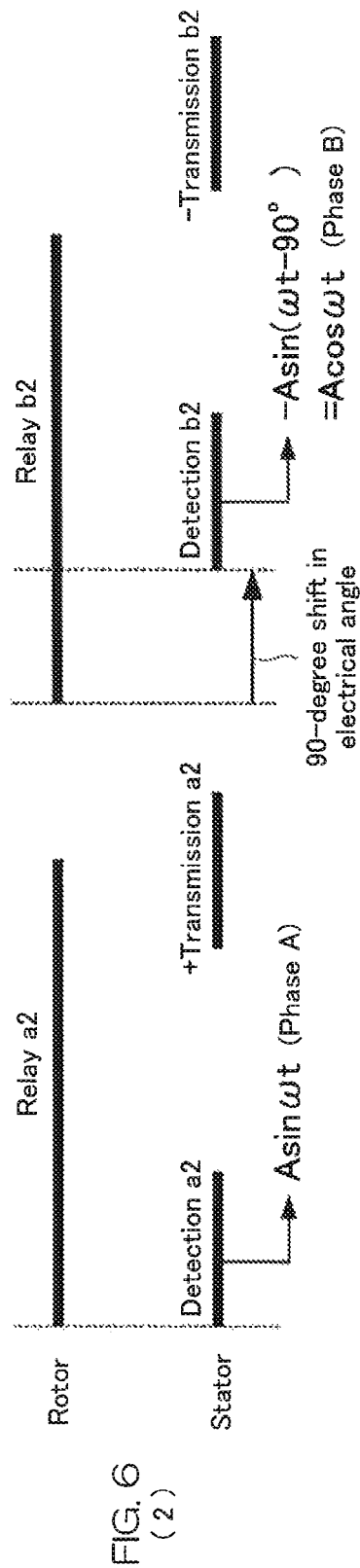
FIG. 6(1)
FIG. 6(2)

FIG. 11

| X (electrodes) | (n, m) | | | | | (Transmission electrode, detection electrode, relay electrode) | | | | |
|---|---|---|---|---|---|---|---|---|---|---|
| 2 | NA | | | | | NA | | | | |
| 3 | (1, 1) | | | | | (4, 4, 3) | | | | |
| 4 | NA | | | | | NA | | | | |
| 5 | (1, 1) | | | | | (4, 4, 5) | | | | |
| 6 | (2, 1) | | | | | (8, 8, 6) | | | | |
| 7 | (1, 2) | | | | | (8, 8, 7) | | | | |
| 8 | NA | | | | | NA | | | | |
| 9 | (1, 2) | (1, 3) | | | | (8, 8, 9) | (12, 12, 9) | | | |
| 10 | (2, 1) | | | | | (8, 8, 10) | | | | |
| 11 | (1, 3) | | | | | (12, 12, 11) | | | | |
| 12 | (4, 1) | | | | | (16, 16, 12) | | | | |
| 13 | (1, 3) | | | | | (12, 12, 13) | | | | |
| 14 | (2, 2) | | | | | (16, 16, 14) | | | | |
| 15 | (1, 4) | (3, 1) | (5, 1) | | | (16, 16, 15) | (12, 12, 15) | (20, 20, 15) | | |
| 16 | NA | | | | | NA | | | | |
| 17 | (1, 4) | | | | | (16, 16, 17) | | | | |
| 18 | (2, 2) | (6, 1) | | | | (16, 16, 18) | (24, 24, 18) | | | |
| 19 | (1, 5) | | | | | (20, 20, 19) | | | | |
| 20 | (4, 1) | | | | | (16, 16, 20) | | | | |
| 21 | (1, 5) | (3, 2) | (7, 1) | | | (20, 20, 21) | (24, 24, 21) | (28, 28, 21) | | |
| 22 | (2, 3) | | | | | (24, 24, 22) | | | | |
| 23 | (1, 6) | | | | | (24, 24, 23) | | | | |
| 24 | (8, 1) | | | | | (32, 32, 24) | | | | |
| 25 | (1, 6) | (5, 1) | | | | (24, 24, 25) | (20, 20, 25) | | | |
| 26 | (2, 3) | | | | | (24, 24, 26) | | | | |
| 27 | (1, 7) | (3, 2) | (9, 1) | | | (28, 28, 27) | (24, 24, 27) | (36, 36, 27) | | |
| 28 | (4, 2) | | | | | (32, 32, 28) | | | | |
| 29 | (1, 7) | | | | | (28, 28, 29) | | | | |
| 30 | (2, 4) | (6, 1) | (10, 1) | | | (32, 32, 30) | (24, 24, 30) | (40, 40, 30) | | |
| 31 | (1, 8) | | | | | (32, 32, 31) | | | | |
| 32 | NA | | | | | NA | | | | |
| 33 | (1, 8) | (3, 3) | (11, 1) | | | (32, 32, 33) | (36, 36, 33) | (44, 44, 33) | | |
| 34 | (2, 4) | | | | | (32, 32, 34) | | | | |
| 35 | (1, 9) | (5, 2) | (7, 1) | | | (36, 36, 35) | (40, 40, 35) | (28, 28, 35) | | |
| 36 | (4, 2) | (12, 1) | | | | (32, 32, 36) | (48, 48, 36) | | | |
| 37 | (1, 9) | | | | | (36, 36, 37) | | | | |
| 38 | (2, 5) | | | | | (40, 40, 38) | | | | |
| 39 | (1, 10) | (3, 3) | (13, 1) | | | (40, 40, 39) | (36, 36, 39) | (52, 52, 39) | | |
| 40 | (8, 1) | | | | | (32, 32, 40) | | | | |
| 41 | (1, 10) | | | | | (40, 40, 41) | | | | |
| 42 | (2, 5) | (6, 2) | (14, 1) | | | (40, 40, 42) | (48, 48, 42) | (56, 56, 42) | | |
| 43 | (1, 11) | | | | | (44, 44, 43) | | | | |
| 44 | (4, 3) | | | | | (48, 48, 44) | | | | |
| 45 | (1, 11) | (3, 4) | (5, 2) | (9, 1) | (15, 1) | (44, 44, 45) | (48, 48, 45) | (40, 40, 45) | (36, 36, 45) | (60, 60, 45) |
| 46 | (2, 6) | | | | | (48, 48, 46) | | | | |
| 47 | (1, 12) | | | | | (48, 48, 47) | | | | |
| 48 | (16, 1) | | | | | (64, 64, 48) | | | | |
| 49 | (1, 12) | (7, 2) | | | | (48, 48, 49) | (56, 56, 49) | | | |
| 50 | (2, 6) | (10, 1) | | | | (48, 48, 50) | (40, 40, 50) | | | |

(a)

(b)

(a)

(b)

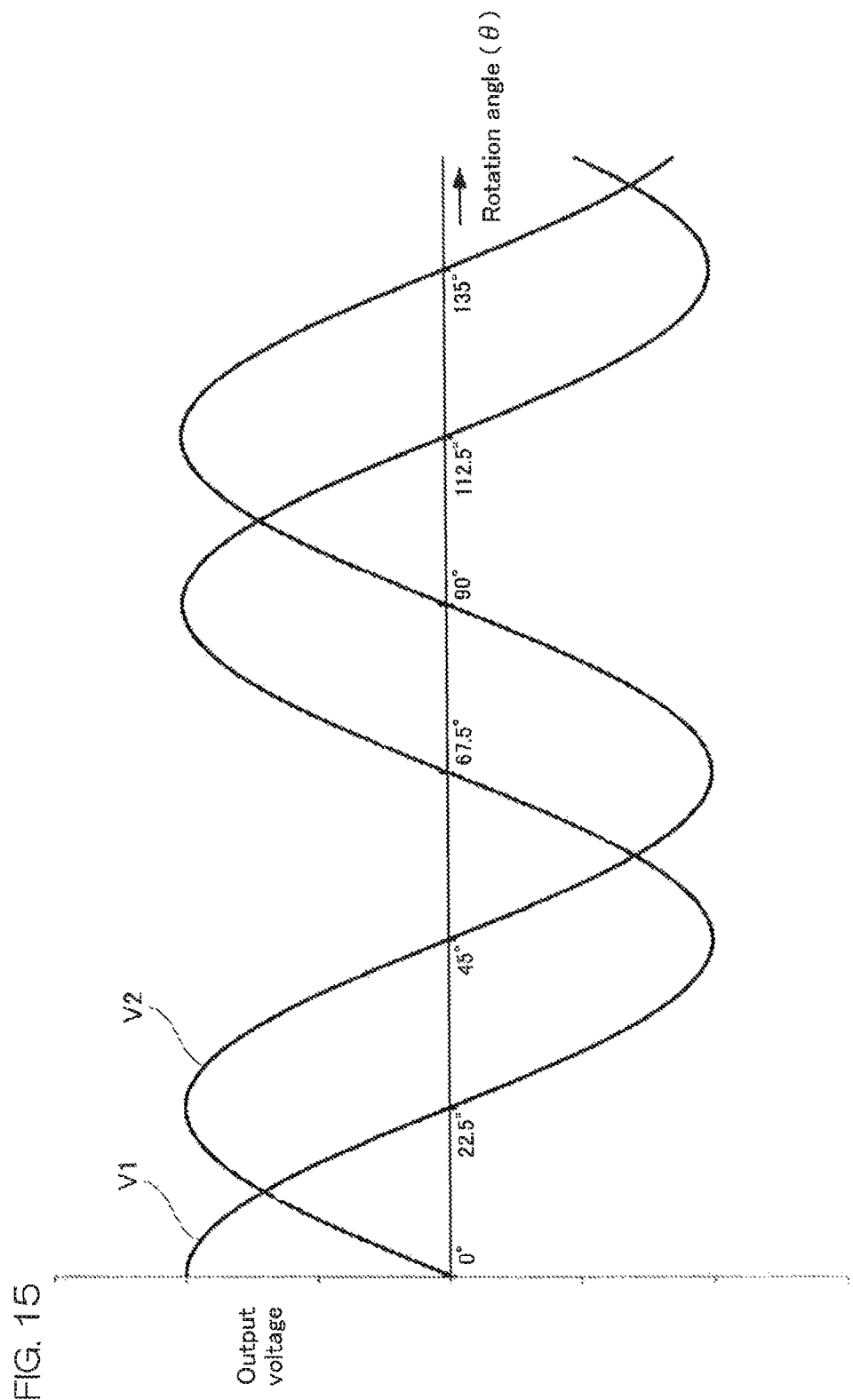

ELECTROSTATIC ENCODER

CROSS-REFERENCE TO RELATED APPLICATIONS

This application is a national stage application under 35 U.S.C. 371 of and claims priority to International Patent Application No. PCT/JP2015/084130, filed Dec. 4, 2015. International Patent Application No. PCT/JP2015/084130 claims priority to Japanese Patent Application No. P2014-255350, filed Dec. 17, 2014. Both International Application No. PCT/JP2015/084130 and Japanese Patent Application No. P2014-255350 are incorporated herein by reference.

TECHNICAL FIELD

The present invention relates to electrostatic encoders and, in more detail, to arrangements of electrodes formed on a stator and a rotor of an electrostatic encoder.

BACKGROUND ART

As shown in FIG. 1, an electrostatic encoder 10 has, on a stator 11, a transmission electrode 12 and a detection electrode 13 and, on a mover 14 to be arranged at a position opposed to the electrodes, a relay electrode 15. A high-frequency signal 16, when being applied to the transmission electrode 12, is transmitted to the detection electrode 13 via a capacitance Ctc defined between the transmission electrode 12 and the relay electrode 15 and a capacitance Ccs defined between the relay electrode 15 and the detection electrode 13. Since the capacitance Ctc and the capacitance Ccs vary depending on the opposed correspondence of the transmission electrode 12, the relay electrode 15, and the detection electrode 13 based on the movement of the mover 14, a high-frequency signal emerging at the detection electrode 13 can be processed in a signal processing circuit 17 to detect the position of the mover 14. The principle of detecting the position of the mover using the electrostatic encoder is as follows.

With reference to FIG. 2, the high-frequency signal 16 is applied to the transmission electrode 12 of the electrostatic encoder 10. The high-frequency signal 16 causes the capacitance Ctc defined between the transmission electrode 12 and the relay electrode 15 to generate an electrostatically induced potential at the relay electrode 15, and the induced potential in turn causes the capacitance Ccs defined between the relay electrode 15 and the detection electrode 13 to generate a detection signal 18 at the detection electrode 13. Assuming that the capacitance Ctc between the transmission electrode 12 and the relay electrode 15 is fixed so as not to change, the capacitance Ccs changes as the mover 14 moves, so that the detection signal 18 has a waveform of amplitude modulation of the high-frequency signal 16. The signal processing circuit 17 can detect the amplitude-modulated signal component to calculate the position of the mover.

Based on the above-described fundamental principle of electrostatic encoder-based position detection, U.S. Pat. No. 4,429,307A (Patent Document 1) discloses an electrostatic encoder with transmission elements 56, 58 and reception elements 60 and conductive elements 50, 52 arranged, respectively, on a disk-shaped fixed disk 48 and a movable disk 46 (see FIGS. 7 and 8 of Patent Document 1). FIG. 3 shows the disk-shaped fixed disk 48 drawn in FIG. 8 of the U.S. patent. In the electrostatic encoder disclosed in the U.S. patent, a transmission signal (A sin ωt, −A sin ωt) transmitted from the transmission elements 56, 58 on the fixed disk 48 is relayed through the conductive elements 50, 52 to be detected at the reception elements 60. As the movable disk 46 rotates, the capacitance between the conductive elements 50, 52 and the reception elements 60 changes. The capacitance change is detected as a potential change, and two sinusoidally modulated output signals can thus be obtained with a mutual phase difference of 90 degrees. The amount of rotational displacement of the movable disk 46 can be detected from an envelope (amplitude modulation) component of the output signals.

PRIOR ART DOCUMENT

Patent Document

Patent Document 1: U.S. Pat. No. 4,429,307A

SUMMARY OF INVENTION

Technical Problem

In the conventional electrostatic encoder shown in FIG. 3, since the transmission elements 56, 58 and the reception elements 60 have their respective different shapes, the magnitude of the parasitic capacitance of the electrostatic encoder, which is operationally undesirable, between the transmission elements 56, 58 and the conductive elements 50, 52 or the parasitic capacitance between the conductive elements 50, 52 and the reception elements 60 differs for each of the transmission elements and the reception elements. This results in a problem that the voltage of amplitude modulation of the output signals from the reception elements 60 deviates positively or negatively. In particular, the wider the spacing between the movable disk 46 and the fixed disk 48, the greater the deviation of the voltage of amplitude modulation of the output signals increases. In addition, the number of the reception elements 60 is large, which results in a problem that it is structurally difficult to downsize the fixed disk 48.

Solution to Problem

The present invention relates to an electrostatic encoder arranged to use the capacitance defined by electrodes that are arranged on the mutually opposed surfaces of first and second insulation members to measure the mutual displacement of the insulation members in a measurement direction, in which two or more relay electrodes are arranged on the first insulation member at a predetermined first electrode cycle in the measurement direction, and transmission electrodes and detection electrodes are arranged alternately on the second insulation member at a predetermined second electrode cycle different from the first electrode cycle in the measurement direction.

Advantageous Effects of Invention

In order to solve the above-described problems, the present invention adopts an electrode arrangement in which the transmission electrodes and the detection electrodes are arranged alternately in the measurement direction, resulting in that all the electrodes can have the same shape to reduce the degree to which the voltage of amplitude modulation of the output signals deviates positively or negatively and, with respect to the variation in the spacing between the first and second insulation members, to further reduce the deviation in the voltage variation of amplitude modulation in the output signals. Further, the reduced number of detection electrodes can lead to a reduction in the number of radially arranged electrodes, which can contribute to downsizing the electrostatic encoder.

BRIEF DESCRIPTION OF DRAWINGS

FIGS. 6(1) and 6(2) illustrate the relationships between electrode arrangements and detection signals.

FIG. 11 is a table showing combinations of the number of transmission electrodes, detection electrodes, and relay electrodes for the number X (2 to 50) of the relay electrodes.

FIG. 15 is a graph showing modulated signals output in response to the rotation of the rotor.

MODES FOR CARRYING OUT THE INVENTION

Figure 1:
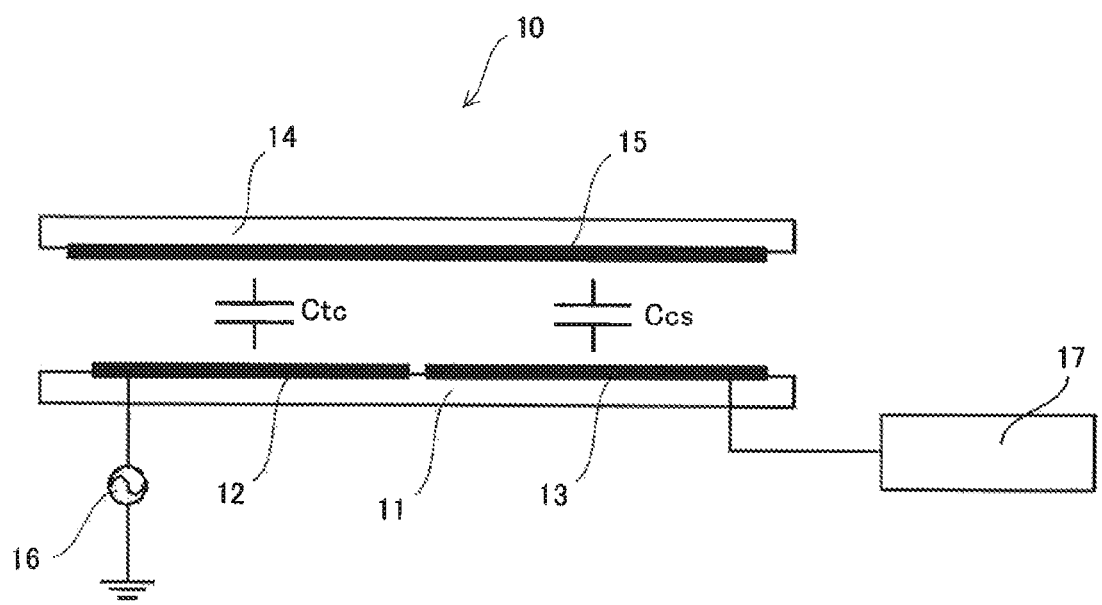
FIG. 1 illustrates the fundamental principle of an electrostatic encoder.
Figure 2:
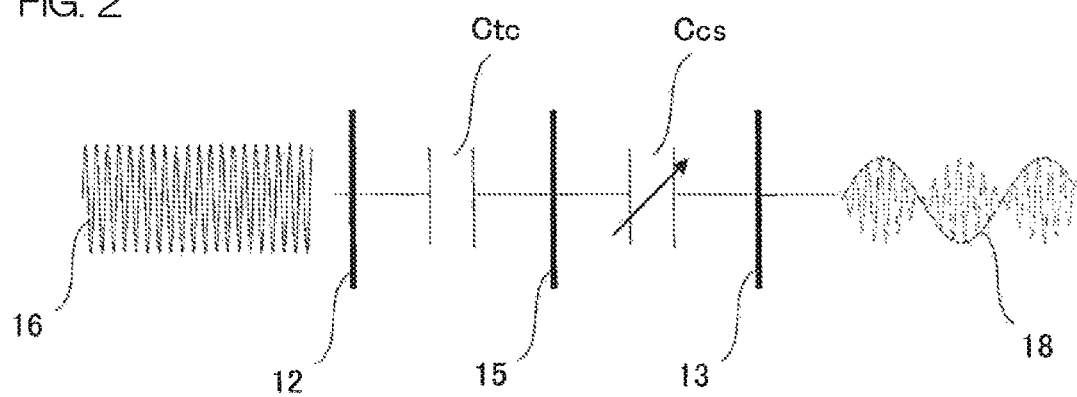
FIG. 2 illustrates the operation of the electrostatic encoder with the configuration shown in FIG. 1.
Figure 3:
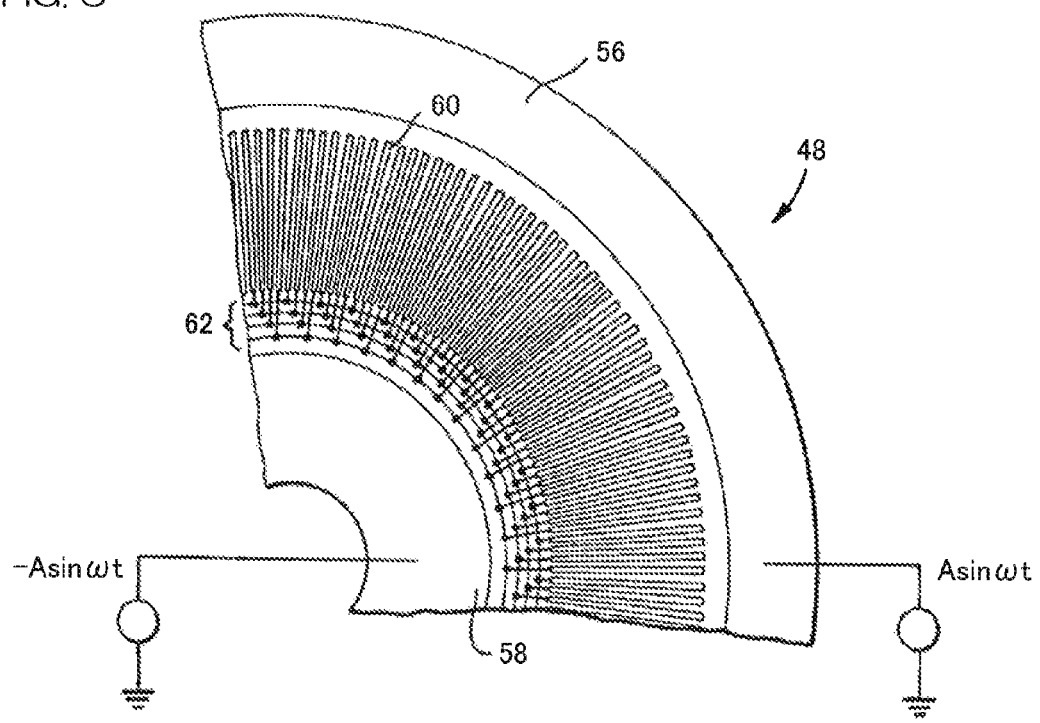
FIG. 3 shows an exemplary electrode arrangement of a conventional electrostatic encoder.
Figure 4:
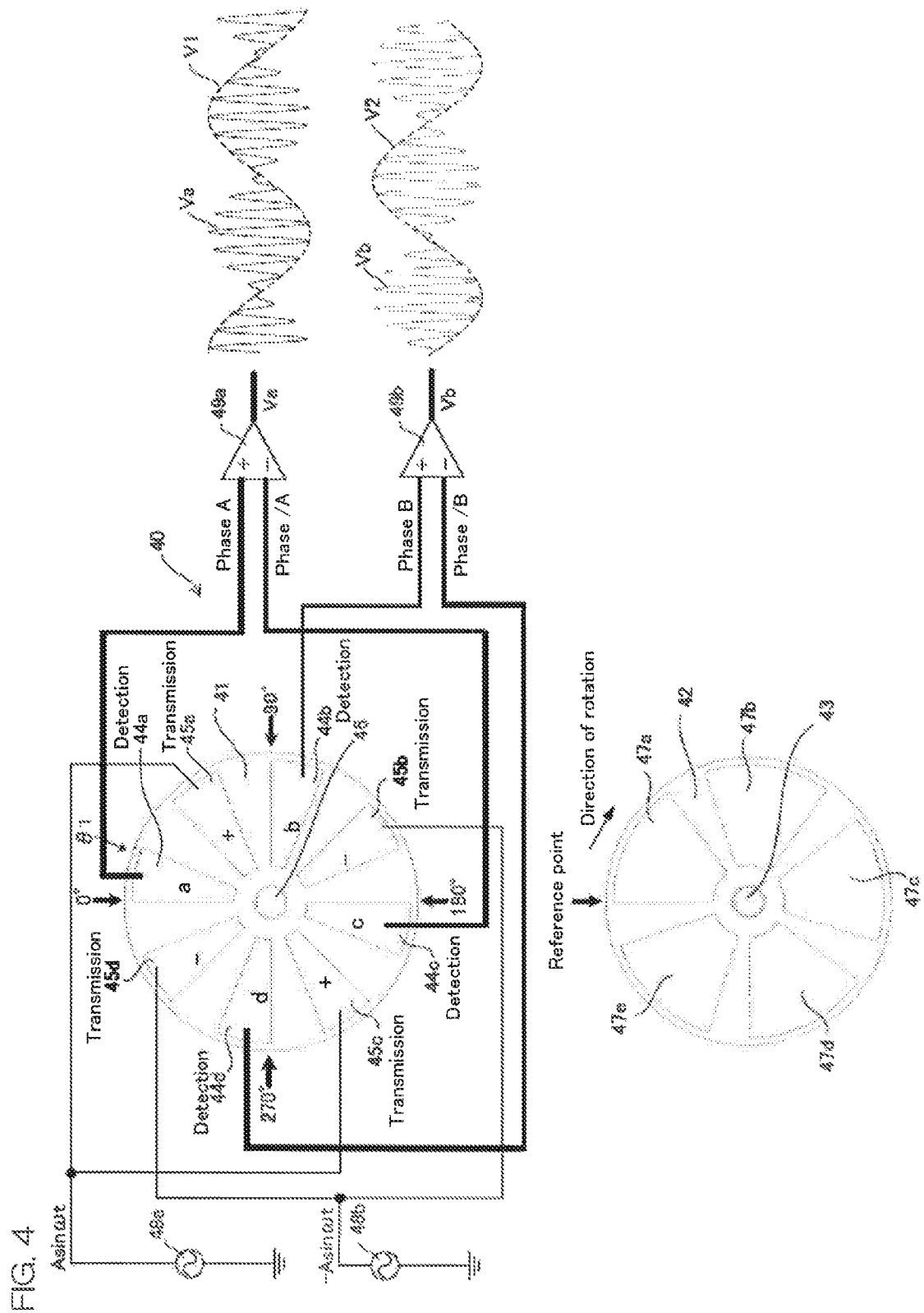
FIG. 4 illustrates the fundamental principle of an electrostatic encoder according to a first embodiment of the present invention.

FIG. 4 illustrates the fundamental principle of obtaining an output signal of a rotary electrostatic encoder 40 according to a first embodiment of the present invention. In the electrostatic encoder 40, a stator 41 and a rotor 42 are arranged with electrodes formed thereon being opposed to each other, and the rotor 42 is coupled rotatably to a central axis 43. The stator 41 includes detection electrodes 44a to 44d and transmission electrodes 45a to 45d arranged radially with respect to a central axis 46. The detection electrodes 44a to 44d and the transmission electrodes 45a to 45d are arranged alternately at regular intervals in the circumferential direction of the stator 41. The rotor 42 includes relay electrodes 47a to 47e each having a shape radiating out from the central axis 43 and arranged at regular intervals. The stator 41 and the rotor 42 are each prepared using, for example, a printed board of a glass epoxy base material with a diameter of 40 millimeters and a thickness of 2 millimeters, on which electrode patterns of copper foils are formed by etching, though these may be formed with another material or another method (The same applies to other examples to be described hereinafter). The stator 41 and the rotor 42 are arranged such that the electrode surfaces are opposed to each other with spacing of about 0.1 millimeters therebetween. As described above, the electrostatic encoder 40 shown in FIG. 4 is an example including the stator 41 with four detection electrodes and four transmission electrodes arranged thereon and the rotor 42 with five relay electrodes arranged thereon.

A high-frequency signal (A sin ωt) 48a is given to the transmission electrodes 45a, 45c, while a high-frequency signal (−A sin ωt) 48b having an inverted phase of the phase of the high-frequency signal 48a is given to the transmission electrodes 45b, 45d. Here, A, ω, and t represent voltage, angular velocity, and time, respectively. The detection electrodes 44a, 44c are coupled, respectively, to a non-inverting input and an inverting input of a differential operational amplifier circuit 49a, while the detection electrodes 44b, 44d are coupled, respectively, to a non-inverting input and an inverting input of a differential operational amplifier circuit 49b.

Figure 5:
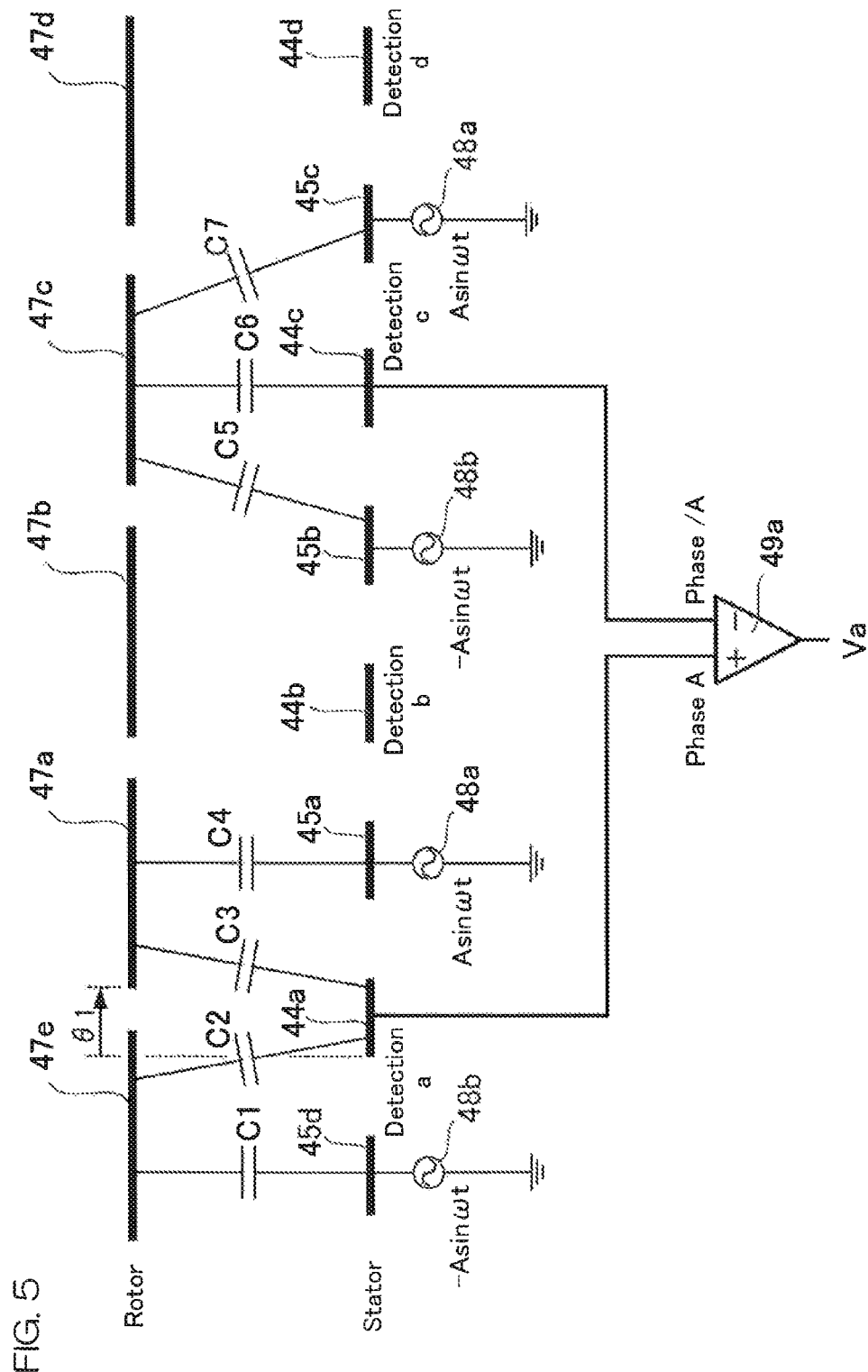
FIG. 5 shows the relationship of capacitances defined between stator electrodes and rotor electrodes of the electrostatic encoder shown in FIG. 4.

When the rotor 42 of the thus arranged electrostatic encoder 40 rotates centering on the central axis 43, the operational amplifier circuit 49a obtains the difference between a phase A detection signal detected at the detection electrode 44a and a phase /A detection signal detected at the detection electrode 44c to output an amplitude-modulated output signal Va. The operational amplifier circuit 49b obtains the difference between a phase B detection signal detected at the detection electrode 44b and a phase /B detection signal detected at the detection electrode 44d to output an amplitude-modulated output signal Vb. The output signals Va, Vb are signals obtained from the high-frequency signals 48a, 48b being transmitted via the capacitances defined between the electrodes on the stator 41 and the electrodes on the rotor 42 and amplitude-modulated based on the change in the capacitances due to rotation of the rotor 42. FIG. 5 schematically shows paths through which the high-frequency signals 48a, 48b are transmitted via the capacitances to the operational amplifier circuit 49a.

FIG. 5 illustrates the capacitances defined between the detection electrodes 44a, 44c and the transmission electrodes 45a to 45d via the relay electrodes 47a to 47e when a reference point (FIG. 4) of the rotor 42 rotates by a rotation angle θ1 from a reference position (0 degrees) of the stator 41. Although the electrodes on the stator 41 and the rotor 42 are arranged in a circumferential manner, for descriptive purposes in FIG. 5, the transmission electrodes, the detection electrodes, and the relay electrodes are drawn linearly to illustrate the capacitances defined between the electrodes.

In the positional relationship between the electrodes shown in FIG. 5, the transmission electrode 45d opposes the relay electrode 47e, between which a capacitance C1 is defined. Also, the transmission electrode 45a opposes the relay electrode 47a, between which a capacitance C4 is defined. Further, capacitances C2, C3 are defined between the detection electrode 44a and the relay electrode 47e and the relay electrode 47a, respectively. Capacitances C5, C7 are defined between the transmission electrodes 45b, 45c and the relay electrode 47c, respectively. Also, a capacitance C6 is defined between the detection electrode 44c and the relay electrode 47c.

In the distribution state of the capacitances shown in FIG. 5, as for the phase A detection signal, the high-frequency signal (A sin ωt) 48a applied to the transmission electrode 45a induces a high-frequency signal via the capacitance C4 in the relay electrode 47a, and the induced high-frequency signal is further transmitted via the capacitance C3 to the detection electrode 44a. Also, the inverted high-frequency signal (−A sin ωt) 48b applied to the transmission electrode 45d induces a high-frequency signal via the capacitance C1 in the relay electrode 47e, and the induced high-frequency signal is further transmitted via the capacitance C2 to the detection electrode 44a. As for the phase /A detection signal, the inverted high-frequency signal 48b applied to the transmission electrode 45b induces a high-frequency signal via the capacitance C5 in the relay electrode 47c, and the induced high-frequency signal is further transmitted via the capacitance C6 to the detection electrode 44c. Also, the high-frequency signal 48a applied to the transmission electrode 45c induces a high-frequency signal via the capacitance C7 in the relay electrode 47c, and the induced high-frequency signal is further transmitted via the capacitance C6 to the detection electrode 44c. It is noted that as for the phase B and phase /B detection signals (FIG. 4), high-frequency signals are transmitted via the capacitances distributed between the electrodes to the detection electrodes in the same manner as described above.

The above-described high-frequency signals transmitted via the capacitances between the electrodes to the detection electrode 44a and the detection electrode 44c are applied to the non-inverting input and the inverting input of the operational amplifier circuit 49a, in which a differential amplifying operation is executed on the input signals to obtain an output signal Va. In FIG. 5, the distribution of the capacitances in the A system (the system arranged to guide the phase A, phase /A detection signals) is shown, but the distribution of the capacitances in the B system (the system arranged to guide the phase B, phase /B detection signals) is not shown. However, using a circuit similar to that in the A system, an output signal Vb from the B system can be obtained. By demodulating the output signals Va, Vb, modulated signals V1, V2 are obtained, which are amplitude modulation components of the output signals Va, Vb. Since the modulated signal V2 has a phase difference of 90 degrees with respect to the modulated signal V1, application of well-known resolver-digital (RD) conversion processing to the modulated signal V1 and the modulated signal V2 allows obtaining the rotation angle of the rotor 42.

The principle of output of detection signals having a mutual phase difference of 90 degrees from the detection electrodes 44a to 44d arranged on the stator 41 and the rotor 42 shown in FIG. 4 will be described. FIG. 6 (1) shows a configuration in which the relay electrodes, the detection electrodes, and the transmission electrodes are arranged at the same electrode cycle (with the same number of electrodes). In the arrangement shown in FIG. 6 (1), a high-frequency signal (A sin ωt) and an inverted high-frequency signal (−A sin ωt) are given alternately to the transmission electrodes (+transmission a1, −transmission b1, ... ). As a result, the detection electrodes (a1, b1, ... ) alternately output a high-frequency signal (A sin ωt) (phase A) and an inverted high-frequency signal (−A sin ωt) (phase /A). On the other hand, in the arrangement shown in FIG. 6 (2), the electrode cycle at which the relay electrodes are arranged is made different from the electrode cycle at which the detection electrodes and the transmission electrodes are arranged, resulting in that detection signals detected at adjacent ones of the detection electrodes have a mutual phase difference. The electrode cycle of the detection electrodes and the transmission electrodes is adjusted with respect to the electrode cycle of the relay electrodes such that a phase difference of 90 degrees occurs between adjacent detection signals. As a result, the detection electrodes (a2, b2, ... ) output detection signals in the order of phase A (A sin ωt), phase B (A cos ωt), phase /A (−A sin ωt), phase /B (−A cos ωt).

As mentioned above, high-frequency signals applied to the transmission electrodes are transmitted via the relay electrodes to the detection electrodes, and output signals are obtained from detection signals detected at the detection electrodes. The capacitances between the electrodes formed on the stator and the rotor vary depending on the rotation of the rotor, by means of which the amplitude of the output signals changes. Since the stator and the rotor are in close relationship with each other, the capacitances between the electrodes are considered to approximately correspond to the surface area (opposed area) of the transmission electrodes and the detection electrodes in the direction orthogonal to the surface of the relay electrodes. That is, the change in the amplitude of the output signals corresponds to the change in the opposed area with the rotation of the rotor. Accordingly, the change in the opposed area with the rotation of the rotor is important in deriving the waveform of the output signals.

Figure 7:
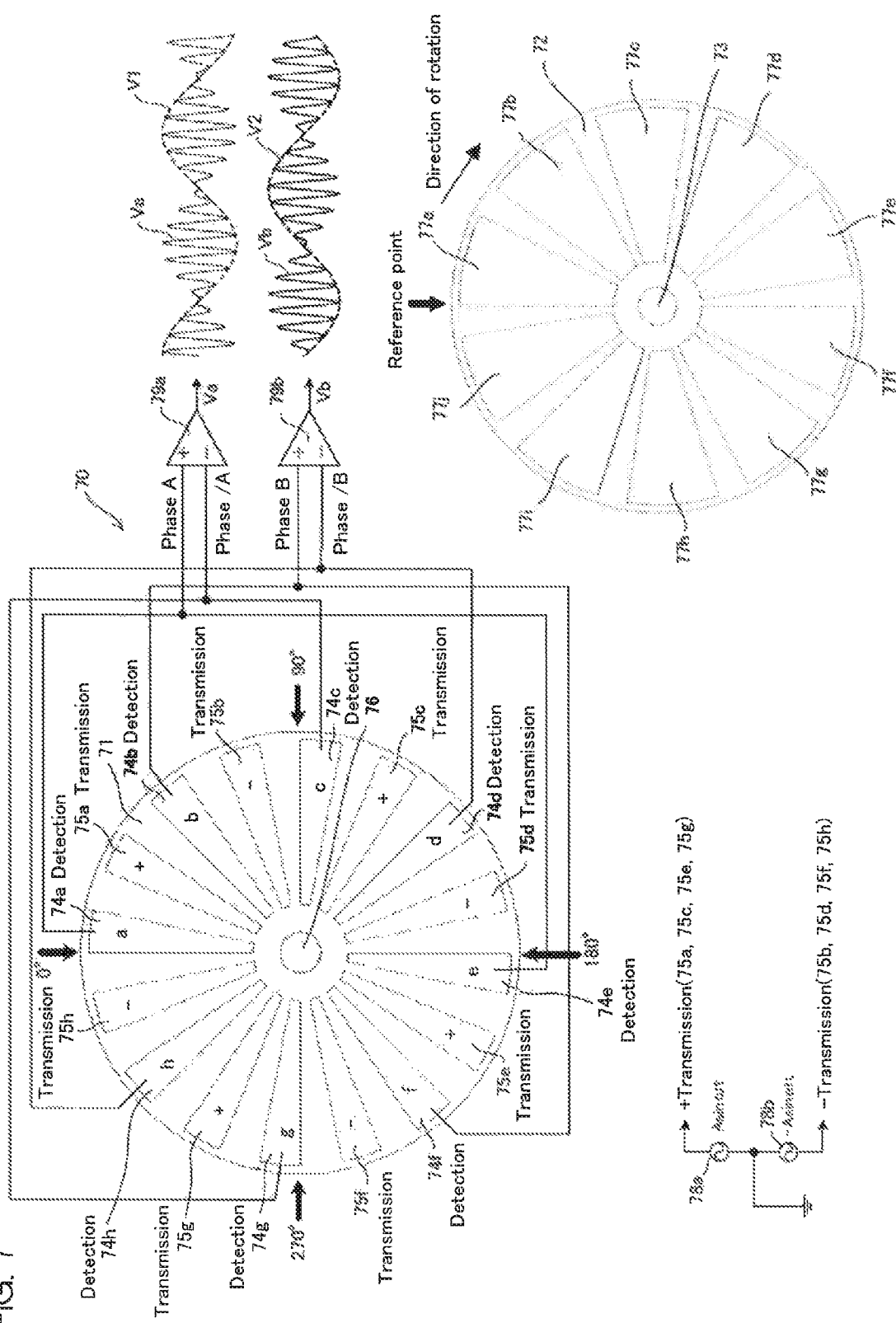
FIG. 7 is a wiring diagram of an electrostatic encoder according to a second embodiment of the present invention.

FIG. 7 is a wiring diagram of a rotary electrostatic encoder 70 according to a second embodiment of the present invention. The electrostatic encoder 70 of the embodiment shown in FIG. 7 includes a stator 71 having eight detection electrodes and eight transmission electrodes and a rotor 72 having ten relay electrodes. In the electrostatic encoder 70, the stator 71 and the rotor 72 are arranged with the electrodes formed thereon being opposed to each other and the rotor 72 is coupled rotatably to a central axis 73. The stator 71 includes the detection electrodes 74a to 74h and the transmission electrodes 75a to 75h arranged radially from a central axis 76 of the stator 71. The detection electrodes 74a to 74h and the transmission electrodes 75a to 75h are arranged alternately at regular intervals in the circumferential direction of the stator 71. The rotor 72 includes relay electrodes 77a to 77j having a shape radiating out from the central axis 73 of the rotor 72 and arranged at regular intervals. A high-frequency signal (V sin ωt) 78a is connected to the transmission electrodes 75a, 75c, 75e, 75g (wiring not shown). A high-frequency signal (−V sin ωt) 78b having an inverted phase of the phase of the high-frequency signal 78a is connected to the transmission electrodes 75b, 75d, 75f, 75h. Here, V, ω, and t represent voltage, angular velocity, and time, respectively. The detection electrodes 74a, 74e (phase A) are coupled to a non-inverting input of an operational amplifier circuit 79a, while the detection electrodes 74c, 74g (phase /A) are coupled to an inverting input of the operational amplifier circuit 79a. Also, the detection electrodes 74b, 74f (phase B) are coupled to a non-inverting input of an operational amplifier circuit 79b, while the detection electrodes 74d, 74h (phase /B) are coupled to an inverting input of the operational amplifier circuit 79b.

When the rotor 72 of the thus arranged electrostatic encoder 70 rotates centering on the central axis 73, the operational amplifier circuit 79a, 79b outputs amplitude-modulated output signals Va, Vb. The output signals Va, Vb are obtained from the high-frequency signal 78a and the inverted high-frequency signal 78b being transmitted via the capacitances defined between the electrodes on the stator 71 and the electrodes on the rotor 72. Hence, the manner in which the opposed area between the transmission electrodes and the relay electrodes and the opposed area between the relay electrodes and the detection electrodes change with the rotation of the rotor will hereinafter be considered.

Figure 8:
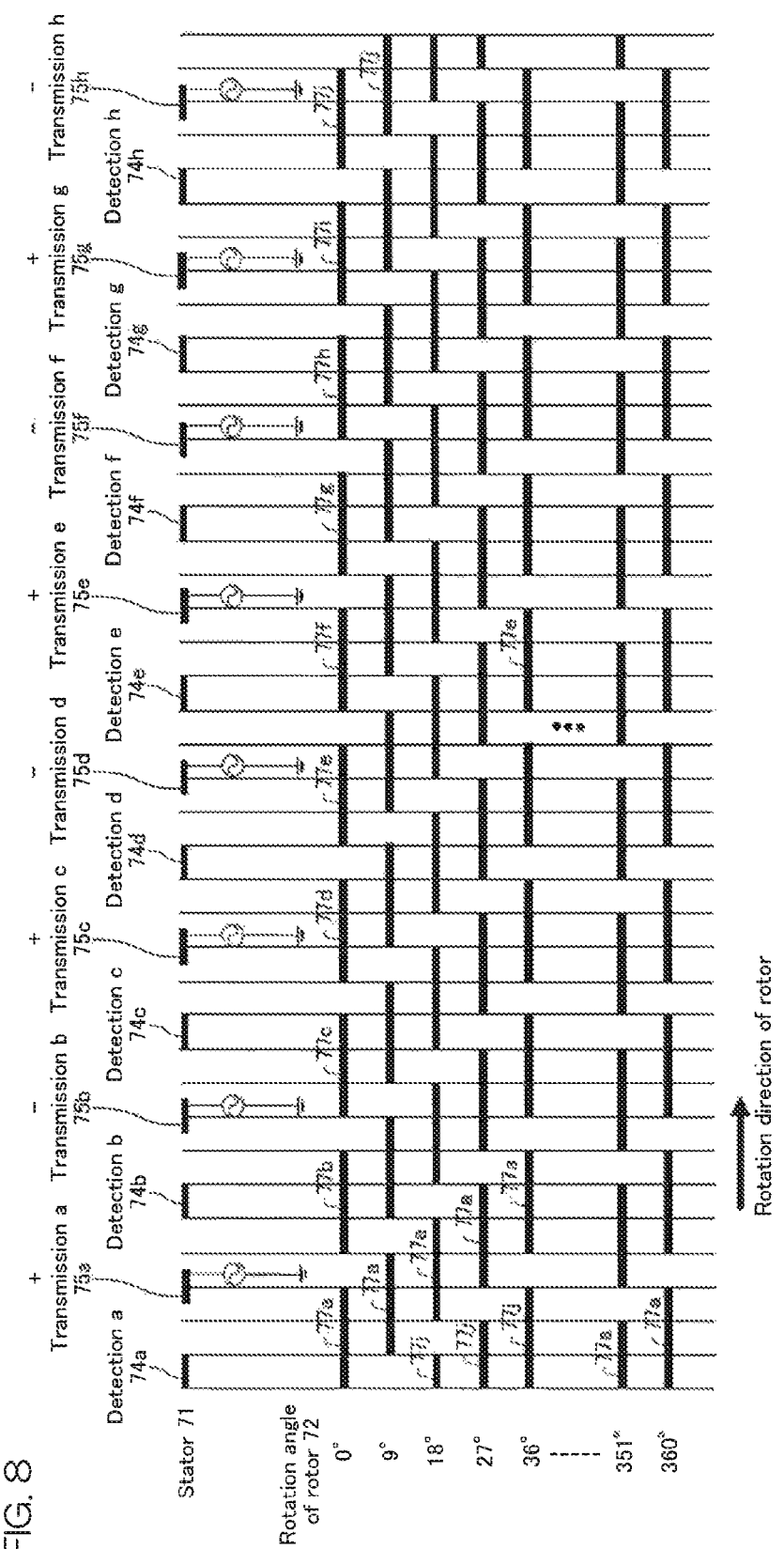
FIG. 8 shows the opposed correspondence between the relay electrodes and the transmission electrodes and the detection electrodes with the rotation of the rotor.

FIG. 8 shows the opposed correspondence between the relay electrodes 77a to 77j and the detection electrodes 74a to 74h and the transmission electrodes 75a to 75h when the rotor 72 rotates. The detection electrodes, the transmission electrodes, and the relay electrodes, which are arranged in a circumferential manner on the stator and the rotor, are drawn linearly in FIG. 8 to clarify the opposed correspondence. Under the assumption that a reference point (FIG. 7) of the rotor 72 rotates from a reference position (0 degrees) of the stator, the respective positions of the relay electrodes 77a to 77j when the rotor 72 rotates by 9, 18, 27, 36, . . . , 351, 360 degrees are shown.

Figure 9:
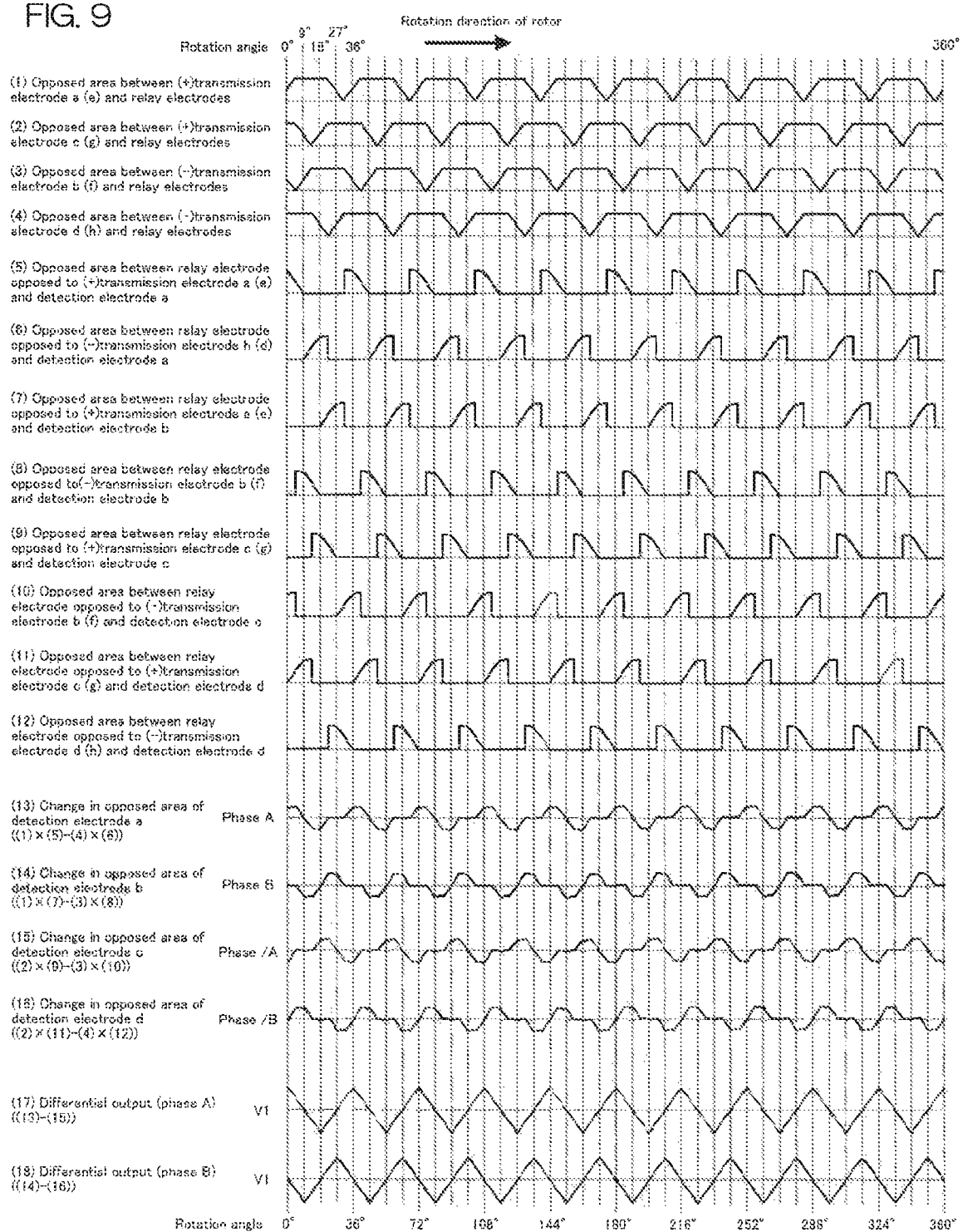
FIG. 9 is a waveform diagram showing the change in the opposed area with the rotation of the rotor.

FIG. 9 is a waveform diagram showing the change in the opposed area when the rotor 72 rotates. With reference to FIG. 8, the change in the opposed area between the transmission electrodes and the relay electrodes will be described. First, FIG. 9 (1) shows the change in the opposed area between the transmission electrode 75a and the relay electrodes. With reference to FIG. 7, when the reference point of the rotor 72 is positioned at 0 degrees of the stator 71 (rotation angle θ=0 degrees), a part (half) of the transmission electrode 75a opposes the relay electrode 77a. As the rotation of the rotor 72 progresses, the relay electrode 77a increases in the opposed area to the transmission electrode 75a to result in that the entire surface of the transmission electrode 75a opposes the relay electrode 77a at an intermediate rotation angle between 0 and 9 degrees (rotation angle θ=4.5 degrees). The opposed area is maximized at this point and the maximized opposed area is maintained until the rotor 72 has an intermediate rotation angle between 18 and 27 degrees (rotation angle θ=22.5 degrees). When the rotation angle of the rotor 72 exceeds 22.5 degrees, the opposed area to the relay electrode 77a starts to decrease, and when the rotor 72 has an intermediate rotation angle between 27 and 36 degrees (rotation angle θ=31.5 degrees), the transmission electrode 75a and the relay electrode 77a no longer have any opposed correspondence therebetween and the opposed area is zero. When the rotation angle of the rotor 72 exceeds 31.5 degrees, the relay electrode 77j starts opposed correspondence with the transmission electrode 75a. When the rotation angle of the rotor 72 reaches 36 degrees, the opposed correspondence between the transmission electrode 75a and the relay electrode 77j is the same as the opposed correspondence between the transmission electrode 75a and the relay electrode 77a at the rotation angle of 0 degrees. Thereafter, the opposed area between the transmission electrode 75a and the relay electrodes (77j, 77i, . . . ) shows the same waveform repeatedly as shown in FIG. 9 (1). It is noted that since the opposed correspondence of the transmission electrode 75e to the relay electrode 77f is the same as the opposed correspondence of the transmission electrode 75a to the relay electrode 77a as shown in FIG. 8, the change in the opposed area between the transmission electrode 75e and the relay electrode has the same waveform as that shown in FIG. 9 (1).

In accordance with the same procedure as described above, the changes in the opposed area between the other transmission electrodes and the relay electrodes are obtained. FIG. 9 (2) shows the change in the opposed area between the transmission electrode 75c (75g) and the relay electrodes. Also, FIG. 9 (3) shows the change in the opposed area between the transmission electrode 75b (75f) and the relay electrodes. Further, FIG. 9 (4) shows the change in the opposed area between the transmission electrode 75d (75h) and the relay electrodes. The change in the opposed area of each transmission electrode to the relay electrodes when the rotor rotates is thus obtained as shown in the waveforms of FIGS. 9 (1) to 9 (4). Next, the change in the opposed area of each detection electrode to the relay electrodes will be considered.

First, the change in the opposed area is obtained between the detection electrode 74a and the relay electrode opposed to the transmission electrode 75a to which the high-frequency signal (V sin ωt) is given. As shown in FIG. 8, when the rotation angle of the rotor 72 is 0 degrees, the relay electrode opposed to the transmission electrode 75a is the relay electrode 77a. The change in the opposed area is therefore obtained between the relay electrode 77a and the detection electrode 74a. As shown in FIG. 8, when the rotation angle of the rotor 72 is 0 degrees, the entire surface of the detection electrode 74a opposes the relay electrode 77a. Accordingly, as shown in FIG. 9 (5), the opposed area is maximized at the rotation angle of 0 degrees. As the rotation of the rotor 72 progresses, the relay electrode 77a moves rightward in FIG. 8, so that the opposed area between the relay electrode 77a and the detection electrode 74a starts to decrease. When the rotation angle of the rotor 72 reaches 9 degrees, the relay electrode 77a and the detection electrode 74a no longer have any opposed correspondence therebetween and the opposed area is zero. Thereafter, the relay electrode opposed to the transmission electrode 75a is in a state not opposed to the detection electrode 74a and the opposed area maintains zero. When the rotor 72 has an intermediate rotation angle between 27 and 36 degrees (rotation angle θ=31.5 degrees), the relay electrode 77j starts opposed correspondence with the transmission electrode 75a. As a result, since the relay electrode 77j opposes the entire surface of the detection electrode 74a at the rotation angle of 31.5 degrees, the opposed area between the relay electrode 77j and the detection electrode 74a is maximized instantly. The maximized opposed area is then maintained until the rotor 72 has a rotation angle of 36 degrees. Thereafter, as shown in FIG. 9 (5), the detection electrode 74a becomes opposed to the subsequent relay electrodes (77i, 77h, . . . ), and the opposed area between them repeats the same change as the opposed area between the relay electrode 77a and the detection electrode 74a. It is noted that since the opposed correspondence of the detection electrode 74e to the relay electrode 77f is the same as the opposed correspondence of the detection electrode 74a to the relay electrode 77a as shown in FIG. 7, the change in the opposed area between the detection electrode 74e and the relay electrodes (77f, 77e, . . . ) has the same waveform as that shown in FIG. 9 (5).

Next, the change in the opposed area is obtained between the detection electrode 74a and the relay electrode opposed to the transmission electrode 75h to which the inverted high-frequency signal (−V sin ωt) is given. As shown in FIG. 8, when the rotation angle of the rotor 72 is 0 degrees, the relay electrode opposed to the transmission electrode 75h to which the inverted high-frequency signal is supplied is the relay electrode 77j. The change in the opposed area is therefore obtained between the relay electrode 77j and the detection electrode 74a. When the rotation angle of the rotor 72 is 0 degrees, the detection electrode 74a is not opposed to the relay electrode 77j, so that the opposed area to the relay electrode 77j is zero when the rotation angle is 0 degrees as shown in FIG. 9 (6) and the opposed area maintains zero until the rotation angle reaches 9 degrees. When the rotation angle exceeds 9 degrees, the opposed area between the relay electrode 77j and the detection electrode 74a starts to increase, and the entire surface of the detection electrode 74a opposes the relay electrode 77j at a rotation angle of 18 degrees with the opposed area being maximized.

Thereafter, the maximized opposed area is maintained until the rotor 72 has an intermediate rotation angle between 18 and 27 degrees (rotation angle θ=22.5 degrees). When the rotation angle exceeds 22.5 degrees, the transmission electrode 75h and the relay electrode 77j no longer have any opposed correspondence therebetween and the opposed area between the detection electrode 74a and the relay electrode 77j is treated as zero instantly. The zero opposed area is then maintained until the rotor 72 has a rotation angle of 36 degrees. Thereafter, as shown in FIG. 9 (6), the detection electrode 74a becomes opposed to the subsequent relay electrodes (77i, 77h, ... ), and the opposed area between them repeats the same change as the opposed area between the relay electrode 77j and the detection electrode 74a. It is noted that since the opposed correspondence of the detection electrode 74a to the relay electrode 77j is the same as the opposed correspondence of the detection electrode 74e to the relay electrode 77e as shown in FIG. 8, the change in the opposed area between the detection electrode 74e and the relay electrode has the same waveform as that shown in FIG. 9 (6).

As mentioned above, the change in the opposed area between the detection electrode 74a and the relay electrode opposed to the transmission electrode 75a to which the high-frequency signal is given and the change in the opposed area between the detection electrode 74a and the relay electrode opposed to the transmission electrode 75h to which the inverted high-frequency signal is given are shown, respectively, in FIGS. 9 (5) and 9 (6). In the same way, the change in the opposed area between the detection electrode 74b and the relay electrode opposed to the transmission electrode 75a to which the high-frequency signal is given, the change in the opposed area between the detection electrode 74b and the relay electrode opposed to the transmission electrode 75b to which the inverted high-frequency signal is given, the change in the opposed area between the detection electrode 74c and the relay electrode opposed to the transmission electrode 75c to which the high-frequency signal is given, the change in the opposed area between the detection electrode 74c and the relay electrode opposed to the transmission electrode 75b to which the inverted high-frequency signal is given, the change in the opposed area between the detection electrode 74d and the relay electrode opposed to the transmission electrode 75c to which the high-frequency signal is given, and the change in the opposed area between the detection electrode 74d and the relay electrode opposed to the transmission electrode 75d to which the inverted high-frequency signal is given are shown, respectively, in FIGS. 9 (7), 9 (8), 9 (9), 9 (10), 9 (11), and 9 (12). It is noted that the change in the opposed areas between the detection electrodes 74f, 74g, 74h and the relay electrodes is the same as each waveform shown in FIGS. 9 (7) to 9 (12).

The change in the opposed areas between the transmission electrodes and the relay electrodes and the change in the opposed areas between the relay electrodes and the detection electrodes have been shown above. By obtaining, from the changes in the opposed areas, the change in the opposed areas between the transmission electrodes and the detection electrodes with the rotation of the rotor, the manner in which the high-frequency signal (inverted high-frequency signal) supplied to the transmission electrodes emerges at the detection electrodes with the rotation of the rotor will be considered. Given a potential V applied to a transmission electrode, by synthesizing the capacitance C1 between the transmission electrode and a relay electrode and the capacitance C2 between the relay electrode and a detection electrode, the potential of a detection signal emerging at the detection electrode is obtained as $V \cdot C1 \cdot C2/(C1+C2)$. However, since the term $(C1+C2)$ shows a near-constant signal waveform, the potential of the detection signal shows a signal waveform of approximately the same shape whether the value of $C1 \cdot C2$ or the value of $C1 \cdot C2/(C1+C2)$ is used as a synthesis capacitance. Accordingly, for the sake of calculation simplicity, the opposed area between the transmission electrode and the detection electrode will hereinafter be obtained by multiplying the opposed area between the transmission electrode and the relay electrode by the opposed area between the relay electrode and the detection electrode.

The detection electrode 74a receives the high-frequency signal supplied to the transmission electrode 75a and transmitted via the relay electrode and also receives the inverted high-frequency signal supplied to the transmission electrode 75h and transmitted via the relay electrode. That is, the change in the opposed area of the detection electrode 74a to the transmission electrode 75a and the transmission electrode 75h corresponds to the change in the detection signal (phase A) detected at the detection electrode 74a. The opposed area of the detection electrode 74a to the transmission electrode 75a corresponds to a value (first value) obtained by multiplying the opposed area (FIG. 9 (1)) between the transmission electrode 75a and the relay electrodes (77a, 77j, ... ) opposed to the transmission electrode 75a by the opposed area (FIG. 9 (5)) between the relay electrodes (77a, 77j, ... ) opposed to the transmission electrode 75a and the detection electrode 74a. The opposed area of the detection electrode 74a to the transmission electrode 75h corresponds to a value (second value) obtained by multiplying the opposed area (FIG. 9 (4)) between the transmission electrode 75h and the relay electrodes (77j, 77i, ... ) opposed to the transmission electrode 75h by the opposed area (FIG. 9 (6)) between the relay electrodes (77j, 77i, ... ) opposed to the transmission electrode 75h and the detection electrode 74a. Accordingly, considering that the transmission electrode 75h is supplied with the inverted high-frequency signal, the opposed area of the detection electrode 74a to the transmission electrode 75a and the transmission electrode 75h is a value obtained by subtracting the second value from the first value, and the change thereof shows a waveform drawn in FIG. 9 (13) depending on the rotation of the rotor.

Next, in the same manner as described above, the detection electrode 74b receives the high-frequency signal supplied to the transmission electrode 75a and transmitted via the relay electrode and also receives the inverted high-frequency signal supplied to the transmission electrode 75b and transmitted via the relay electrode. That is, the change in the opposed area of the detection electrode 74b to the transmission electrode 75a and the transmission electrode 75b corresponds to the change in the detection signal (phase B) detected at the detection electrode 74b. The opposed area of the detection electrode 74b to the transmission electrode 75a corresponds to a value (third value) obtained by multiplying the opposed area (FIG. 9 (1)) between the transmission electrode 75a and the relay electrodes (77a, 77j, ... ) opposed to the transmission electrode 75a by the opposed area (FIG. 9 (7)) between the relay electrodes (77a, 77j, ... ) opposed to the transmission electrode 75a and the detection electrode 74b. The opposed area of the detection electrode 74b to the transmission electrode 75b corresponds to a value (fourth value) obtained by multiplying the opposed area (FIG. 9 (3)) between the transmission electrode 75b and the relay electrodes (77c, 77b, ... ) opposed to the transmission electrode 75b by the opposed area (FIG.

9 (8)) between the relay electrodes (77c, 77b, . . . ) opposed to the transmission electrode 75b and the detection electrode 74b. Accordingly, considering that the transmission electrode 75b is supplied with the inverted high-frequency signal, the opposed area of the detection electrode 74b to the transmission electrode 75a and the transmission electrode 75b is a value obtained by subtracting the fourth value from the third value, and the change thereof shows a waveform drawn in FIG. 9 (14) depending on the rotation of the rotor.

Further, the change in the opposed area of the detection electrode 74c to the transmission electrode 75b and the transmission electrode 75c corresponds to the change in the detection signal (phase /A) detected at the detection electrode 74c. The opposed area of the detection electrode 74c to the transmission electrode 75c corresponds to a value (fifth value) obtained by multiplying the opposed area (FIG. 9 (2)) between the transmission electrode 75c and the relay electrodes (77d, 77c, . . . ) opposed to the transmission electrode 75c by the opposed area (FIG. 9 (9)) between the relay electrodes (77d, 77c, . . . ) opposed to the transmission electrode 75c and the detection electrode 74c. The opposed area of the detection electrode 74c to the transmission electrode 75b corresponds to a value (sixth value) obtained by multiplying the opposed area (FIG. 9 (3)) between the transmission electrode 75b and the relay electrodes (77c, 77b, . . . ) opposed to the transmission electrode 75b by the opposed area (FIG. 9 (10)) between the relay electrodes (77c, 77b, . . . ) opposed to the transmission electrode 75b and the detection electrode 74c. Accordingly, considering that the transmission electrode 75b is supplied with the inverted high-frequency signal, the opposed area of the detection electrode 74c to the transmission electrode 75b and the transmission electrode 75c is a value obtained by subtracting the sixth value from the fifth value, and the change thereof shows a waveform drawn in FIG. 9 (15) depending on the rotation of the rotor.

Further, the change in the opposed area of the detection electrode 74d to the transmission electrode 75c and the transmission electrode 75d corresponds to the change in the detection signal (phase /B) detected at the detection electrode 74d. The opposed area of the detection electrode 74d to the transmission electrode 75c corresponds to a value (seventh value) obtained by multiplying the opposed area (FIG. 9 (2)) between the transmission electrode 75c and the relay electrodes (77d, 77c, . . . ) opposed to the transmission electrode 75c by the opposed area (FIG. 9 (11)) between the relay electrodes (77d, 77c, . . . ) opposed to the transmission electrode 75c and the detection electrode 74d. The opposed area of the detection electrode 74d to the transmission electrode 75d corresponds to a value (eighth value) obtained by multiplying the opposed area (FIG. 9 (4)) between the transmission electrode 75d and the relay electrodes (77e, 77d, . . . ) opposed to the transmission electrode 75d by the opposed area (FIG. 9 (12)) between the relay electrodes (77e, 77d, . . . ) opposed to the transmission electrode 75d and the detection electrode 74d. Accordingly, considering that the transmission electrode 75d is supplied with the inverted high-frequency signal, the opposed area of the detection electrode 74d to the transmission electrode 75c and the transmission electrode 75d is a value obtained by subtracting the eighth value from the seventh value, and the change thereof shows a waveform drawn in FIG. 9 (16) depending on the rotation of the rotor.

As described above, FIGS. 9 (13) to 9 (16) show the respective changes in the opposed areas of the detection electrodes 74a, 74b, 74c, 74d to the transmission electrodes that transmit the high-frequency signal and the transmission electrodes that transmit the inverted high-frequency signal with the rotation of the rotor. As a result, the waveforms of the detection signals detected at the respective detection electrodes 74a, 74b, 74c, 74d correspond, respectively, to the waveforms of the changes in the opposed areas. It is noted that since the positional relationships of the detection electrodes 74e, 74f, 74g, 74h to the transmission electrodes 75e, 75f, 75g, 75h are the same as the positional relationships in the case of the detection electrodes 74a, 74b, 74c, 74d, the changes in the opposed areas of the detection electrodes 74e, 74f, 74g, 74h to the transmission electrodes that transmit the high-frequency signal and the transmission electrodes that transmit the inverted high-frequency signal with the rotation of the rotor are the same as the changes in the case of the detection electrodes 74a, 74b, 74c, 74d. The detection electrodes 74e, 74f, 74g, 74h are therefore coupled to the respective detection electrodes 74a, 74b, 74c, 74d and also coupled to the inputs of the operational amplifiers 79a, 79b.

Figure 10:
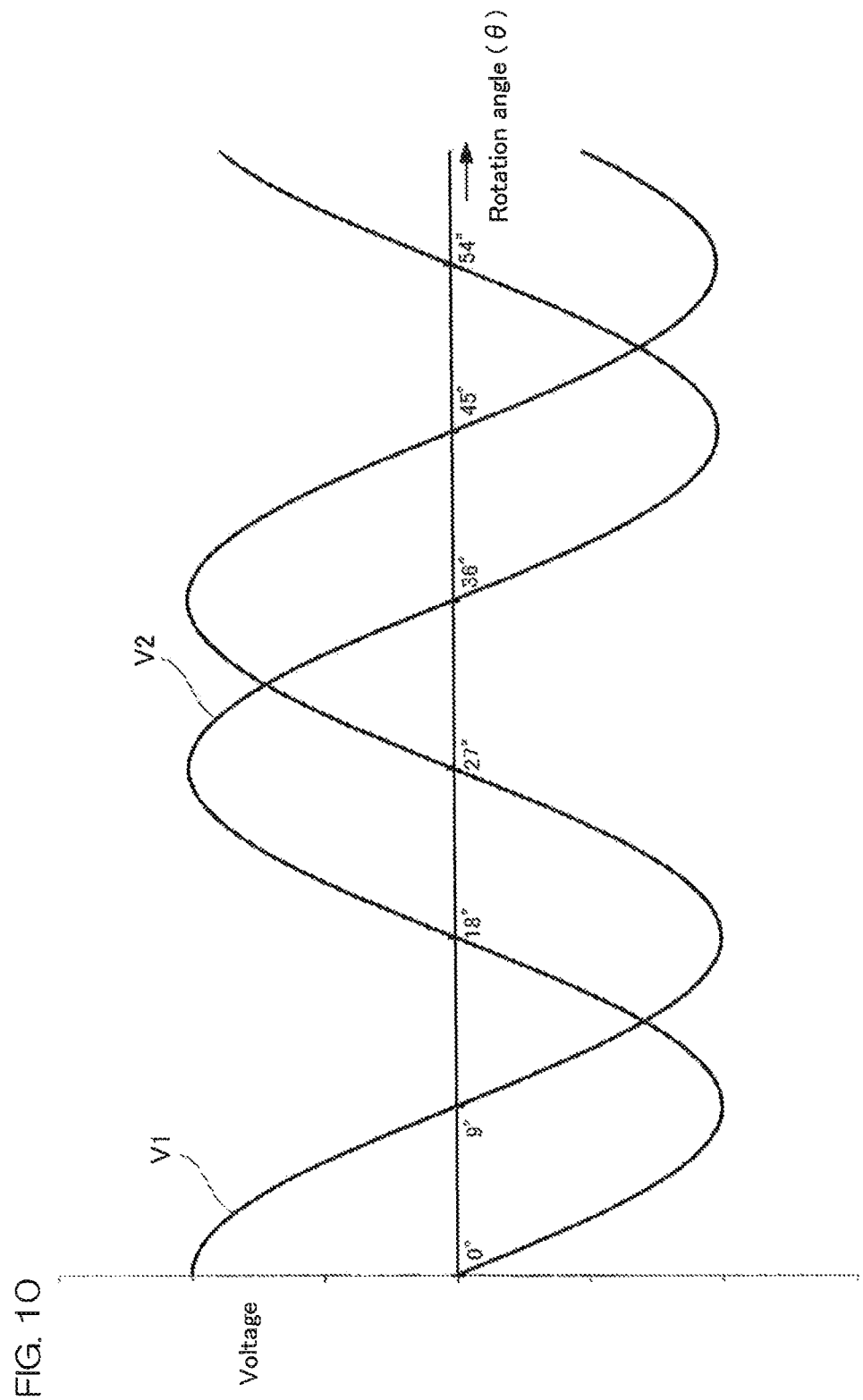
FIG. 10 is a graph showing modulated signals output in response to the rotation of the rotor.

The difference between the phase A waveform shown in FIG. 9 (13) and the phase /A waveform shown in FIG. 9 (15) provides a differential output of a triangular waveform shown in FIG. 9 (17). Since the phase A waveform and the phase /A waveform have 180-degree inverted phases, the difference between the two waveforms can provide a sinusoidal waveform having a larger amplitude (the same applies to the phase B waveform and the phase /B waveform). The difference between the phase B waveform shown in FIG. 9 (14) and the phase /B waveform shown in FIG. 9 (16) provides a differential output of a triangular waveform shown in FIG. 9 (18). The triangular waveform shown in FIG. 9 (17) has a phase difference of 90 degrees with respect to the triangular waveform shown in FIG. 9 (18). Accordingly, the high-frequency signal and the inverted high-frequency signal applied to the transmission electrodes of the stator 71 are amplitude-modulated by the differential outputs shown in FIGS. 9 (17) and 9 (18) with the rotation of the rotor 72. However, the output signals Va, Vb output from the operational amplifiers 79a, 79b do not represent signals amplitude-modulated by the triangular waveforms shown in FIGS. 9 (17) and 9 (18), but actually represent signals V1, V2 amplitude-modulated by such sinusoidal waveforms as shown in FIG. 10. Since the capacitance between electrodes is actually defined not only by the area with which the electrodes are opposed directly (orthogonally) to each other, but also obliquely depending on the distance between the electrodes, the movement of a rotor having electrodes with smaller spacing therebetween causes the actual change in the capacitance between the electrodes not to be triangular but to be near sinusoidal. Accordingly, the voltage of the output signals Va, Vb output from the operational amplifiers 79a, 79b also shows a signal waveform amplitude-modulated by a sinusoidal waveform.

The output signals Va, Vb output from the operational amplifiers 79a, 79b are demodulated by a demodulator not shown, and the demodulator outputs modulated signals V1, V2 shown in FIG. 10. Since the modulated signals V1, V2 have a relative phase difference of 90 degrees, applying well-known resolver-digital (RD) conversion processing to the modulated signal V1 and the modulated signal V2 allows obtaining the rotation angle of the rotor 72. Since the ten relay electrodes 77a to 77j are arranged on the rotor 72, one revolution (by 360 degrees) of the rotor 72 causes the electrostatic encoder 71 to output ten cycles of sinusoidal wave as shown in FIGS. 9 (17) and 9 (18). As shown in FIG. 7, the electrostatic encoder according to the present embodiment thus includes the stator with the transmission electrodes and the detection electrodes arranged alternately thereon in the direction of rotation and the rotor arranged proximal to the stator, and the rotation angle of the rotor can be obtained from modulated signals of sinusoidal waveforms output with the rotation of the rotor and having a mutual phase difference of 90 degrees.

For the case where X relay electrodes are arranged on the rotor and 4 n transmission electrodes and 4 n detection electrodes are arranged alternately on the stator, an electrode arrangement condition under which detection signals having a phase difference of 90 degrees in the electrical angle are detected at the detection electrodes will now be considered. In order for the pitch (mechanical angle) of adjacent ones of the detection electrodes to shift by 0.25 pitches of the relay electrodes (corresponding to a phase difference of 90 degrees in the electrical angle), it is sufficient that a natural number "n" other than 0 meeting the following formula (1) exists.

$$X/4n=1\pm0.25 \tag{1}$$

That is, when "n" meeting the formula (1) exists, detection signals having a phase difference of 90 degrees in the electrical angle between adjacent ones of the detection electrodes are detected. For the case where the formula (1) is further generalized to divide the detection electrodes arranged on the stator into 4 n groups in the direction of rotation such that the number of detection electrodes in one group is m (the number of all the detection electrodes is 4 nm), in order for the pitch of detection electrodes in adjacent ones of the groups m-th away from each other to shift by 0.25 pitches of the relay electrodes (corresponding to a phase difference of 90 degrees in the electrical angle), it is sufficient that natural numbers "n," "m" other than 0 meeting the following formula (2) exist.

$$X/4n=m\pm0.25 \tag{2}$$

That is, when "n" and "m" meeting the formula (2) exist, detection signals having a phase difference of 90 degrees in the electrical angle between the detection electrodes m-th away from each other are detected.

FIG. 11 is a table showing combinations of transmission electrodes, detection electrodes, and relay electrodes meeting the formula (2) for the case where the number X of relay electrodes is 2 to 50. For example, when the number X of relay electrodes is 5, n=1 and m=1 meet the formula (2), with which such an electrostatic encoder as shown in FIG. 4 can be achieved including four transmission electrodes, four detection electrodes, and five relay electrodes. Also, when the number X of relay electrodes is 10, n=2 and m=1 meet the formula (2), with which such an electrostatic encoder as shown in FIG. 7 can be achieved including eight transmission electrodes, eight detection electrodes, and ten relay electrodes.

Figure 12:
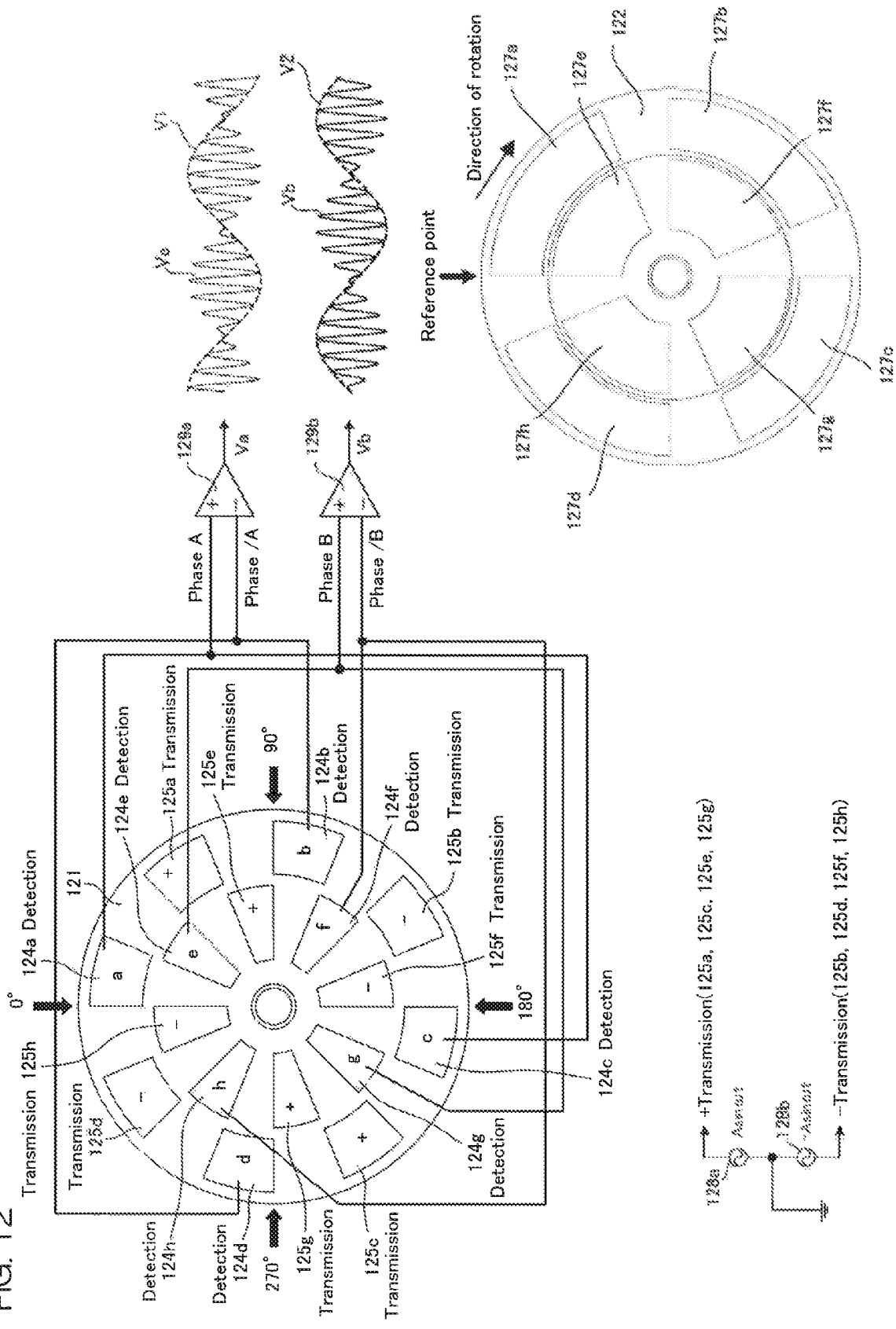
FIG. 12 is a wiring diagram of an electrostatic encoder according to a third embodiment of the present invention.

While one layer of electrodes is arranged circumferentially on the stator and rotor in the above-described electrostatic encoders, the electrodes may be arranged in two layers from the center toward the outer periphery on the stator and the rotor. FIG. 12 shows an electrostatic encoder 120 according to a third embodiment. In the electrostatic encoder 120, two (outer and inner) layers of electrodes are arranged circumferentially on the stator and the rotor. Specifically, four transmission electrodes and four detection electrodes are arranged at regular intervals on each surface of the zonal outer and inner layers on the stator 121. Also, four relay electrodes are arranged at regular intervals on each surface of the zonal outer and inner layers on the rotor 122.

The electrostatic encoder 120 shown in FIG. 12 includes the stator 121 in which the detection electrodes 124a to 124d and the transmission electrodes 125a to 125d are arranged alternately on the outer layer and the detection electrodes 124e to 124h and the transmission electrodes 125e to 125h are arranged alternately on the inner layer, and the rotor 122 in which four of the relay electrodes 127a to 127h are arranged on each of the outer and inner layers. The detection electrodes 124a to 124d and the transmission electrodes 125a to 125d arranged on the outer layer and the detection electrodes 124e to 124h and the transmission electrodes 125e to 125h arranged on the inner layer in the stator 121 have their respective rotation angles mutually shifted by 22.5 degrees. As a result, as described with reference to the principle of detection in FIG. 6 (1), the outer layer defines a system (phase A system) arranged to guide phase A and phase /A detection signals, and the inner layer defines a system (phase B system) arranged to guide phase B and phase /B detection signals. The phase A and phase /A detection signals and the phase B and phase /B detection signals are input, respectively, to differential operational amplifiers 129a, 129b, and output signals Va, Vb to be amplitude-modulated with the rotation of the rotor 122 are output from the operational amplifiers 129a, 129b. The output signals Va, Vb are demodulated to output modulated signals V1, V2, which have a mutual phase difference of 90 degrees. The rotation angle of the rotor 122 is obtained from the modulated signals V1, V2.

The electrostatic encoder 120 shown in FIG. 12 outputting the modulated signals V1, V2 that have a mutual phase difference of 90 degrees will next be considered below. FIG. 13(a) shows the relative positional relationship with the rotation of the rotor 122 between the detection electrodes 124a to 124d and the transmission electrodes 125a to 125d arranged on the outer layer of the stator 121 and the relay electrodes 127a to 127d arranged on the outer layer of the rotor 122. FIG. 13(b) is a waveform diagram showing the change in the opposed area between electrodes with the rotation of the rotor 122 and the change in the differential output (phase A system) based on the change in the opposed area. The transmission electrodes and the detection electrodes on the stator and the relay electrodes on the rotor, which are arranged in a circumferential manner on the rotor and the stator, are drawn linearly in FIG. 13(a) to clarify the opposed correspondence.

The change in the opposed area between the detection electrodes 124a to 124d and the transmission electrodes 125a to 125d arranged on the outer layer of the stator 120 and the relay electrodes 127a to 127d arranged on the outer layer of the rotor 122 will first be considered. With reference to FIGS. 13(a) and 13(b) (1), when the rotation angle of the rotor 122 is, for example, 0 degrees, the transmission electrode 125a completely opposes the relay electrode 127a (maximum opposed area) and continues to stay in the state until the rotation angle reaches 45 degrees. Thereafter, the opposed area to the relay electrode 127a decreases to reach zero at the rotation angle of 67.5 degrees. When the opposed area to the relay electrode 127a reaches zero at the rotation angle of 67.5 degrees, the relay electrode 127d starts opposed correspondence with the transmission electrode 125a and then completely opposes the transmission electrode 125a at the rotation angle of 90 degrees. Thereafter, the opposed area between the transmission electrode 125a and the relay electrodes shows the same waveform repeatedly as shown in FIG. 13(b) (1). It is noted that since the opposed correspondences of the transmission electrodes 125b, 125c, 125d to the relay electrodes 127b, 127c, 127d are the same as the opposed correspondence of the transmission electrode 125a to the relay electrode 127a as shown in FIG. 13(a), the change in the opposed areas between the transmission electrode 125b, 125c, 125d and the relay electrodes has the same waveform as those shown in FIGS. 13(b)(1) and 13(b)(2).

Next, the change in the opposed area between the relay electrodes opposed to the transmission electrodes and the detection electrodes will be considered. As shown in FIG. 13(a), when the rotation angle of the rotor 122 is 0 degrees, the relay electrode opposed to the transmission electrode 125a is the relay electrode 127a. Accordingly, since the detection electrode 124a receives the high-frequency signal from the transmission electrode 125a via the relay electrode 127a, the change in the opposed area between the relay electrode 127a and the detection electrode 124a is obtained. As shown in FIG. 13(a), when the rotation angle of the rotor 122 is 0 degrees, the entire surface of the detection electrode 124a opposes the relay electrode 127a. Accordingly, as shown in FIG. 13(b) (3), the opposed area is maximized at the rotation angle of 0 degrees. As the rotation of the rotor 122 progresses, the relay electrode 127a moves rightward in FIG. 13(a), so that the opposed area between the relay electrode 127a and the detection electrode 124a starts to decrease. When the rotation angle of the rotor 122 reaches 22.5 degrees, the relay electrode 127a and the detection electrode 124a no longer have any opposed correspondence therebetween and the opposed area is zero. Thereafter, the relay electrode opposed to the transmission electrode 125a is in a state not opposed to the detection electrode 124a and the opposed area maintains zero. When the rotation angle of the rotor 122 reaches 67.5 degrees, the relay electrode 127d starts opposed correspondence with the transmission electrode 125a. Since the relay electrode 127d opposes the entire surface of the detection electrode 124a at the rotation angle of 67.5 degrees, the opposed area between the relay electrode 127d and the detection electrode 124a is maximized instantly. The maximized opposed area is then maintained until the rotor 122 has a rotation angle of 90 degrees. Thereafter, as shown in FIG. 13(b) (3), the detection electrode 124a becomes opposed to the subsequent relay electrodes (127c, 127b, . . . ), and the opposed area between them repeats the same change as the opposed area between the relay electrode 127a and the detection electrode 124a. It is noted that since the opposed correspondence of the detection electrode 124c to the relay electrode 127c is the same as the opposed correspondence of the detection electrode 124a to the relay electrode 127a as shown in FIG. 13(a), the change in the opposed area between the detection electrode 124c and the relay electrodes (127c, 127b, . . . ) has the same waveform as that shown in FIG. 13(b) (3).

Considering the changes in the opposed areas between other electrodes in accordance with the same procedure as described above, . 13 (b) (4) shows the change in the opposed area between the relay electrode opposed to the transmission electrode 125b and the detection electrode 124c and the change in the opposed area between the relay electrode opposed to the transmission electrode 125d and the detection electrode 124a. Also, FIG. 13(b) (5) shows the change in the opposed area between the relay electrode opposed to the transmission electrode 125a and the detection electrode 124b and the change in the opposed area between the relay electrode opposed to the transmission electrode 125c and the detection electrode 124d. Further, FIG. 13(b) (6) shows the change in the opposed area between the relay electrode opposed to the transmission electrode 125b and the detection electrode 124b and the change in the opposed area between the relay electrode opposed to the transmission electrode 125d and the detection electrode 124d.

The change in the opposed areas between the transmission electrodes and the relay electrodes and the change in the opposed areas between the relay electrodes and the detection electrodes have thus been shown. From the changes in the opposed areas, the change in the opposed areas of the detection electrodes arranged on the outer layer to the transmission electrodes with the rotation of the rotor will be considered.

First, the detection electrode 124a receives the high-frequency signal (A sin ωt) transmitted from the transmission electrode 125a via the relay electrode and the inverted high-frequency signal (−A sin ωt) transmitted from the transmission electrode 125d via the relay electrode. The high-frequency signal received at the detection electrode 124a is amplitude-modulated in accordance with the capacitance between the transmission electrode 125a and the relay electrode opposed to the transmission electrode 125a and the capacitance between the relay electrode and the detection electrode 124a. The inverted high-frequency signal received at the detection electrode 124a is amplitude-modulated in accordance with the capacitance between the transmission electrode 125d and the relay electrode opposed to the transmission electrode 125d and the capacitance between the relay electrode and the detection electrode 124a. Accordingly, since the capacitances are considered to correspond to the opposed areas, the detection signal received at the detection electrode 124a is amplitude-modulated by a value obtained by multiplying the opposed area (FIG. 13(b) (1)) between the transmission electrode 125a and the relay electrode by the opposed area (FIG. 13(b) (3)) between the relay electrode opposed to the transmission electrode 125a and the detection electrode 124a while the detection electrode 124a receives the high-frequency signal, and also is amplitude-modulated by a value obtained by multiplying the opposed area (FIG. 13(b) (2)) between the transmission electrode 125d and the relay electrode by the opposed area (FIG. 13(b) (4)) between the relay electrode opposed to the transmission electrode 125d and the detection electrode 124a while the detection electrode 124a receives the inverted high-frequency signal. That is, the detection signal detected at the detection electrode 124a is amplitude-modulated by a triangular waveform shown in FIG. 13(b) (7). It is noted that since the detection electrode 124c generates the same signal as the detection electrode 124a, the detection electrode 124a and the detection electrode 124c are coupled so that the signal is input as a phase A detection signal to the differential operational amplifier 129a.

In the same manner as described above, the phase /A detection signal detected at the detection electrode 124b is amplitude-modulated by a triangular waveform shown in FIG. 13(b) (8). Since the triangular waveform shown in FIG. 13(b) (8) is equal to the triangular waveform obtained by inverting the triangular waveform shown in FIG. 13(b) (7), the phase /A detection signal is differentially amplified with the phase A detection signal at the differential operational amplifier 129a to obtain a larger output signal Va.

Next, the change in the opposed area between the detection electrodes 124e to 124h and the transmission electrodes 125e to 125h arranged on the inner layer of the stator 120 and the relay electrodes 127e to 127h arranged on the inner layer of the rotor 122 is obtained in the same way as the change in the opposed area between electrodes arranged on the outer layers. FIG. 14(a) shows the relative positional relationship between electrodes arranged on the inner layers with the rotation of the rotor, and FIG. 14(b) is a waveform diagram showing the change in the opposed area between the electrodes arranged on the inner layers with the rotation of the rotor and the change in the differential output (phase B system) based on the change in the opposed area. FIG. 14(b) (1) shows the change in the opposed area between the transmission electrode 125e (transmission electrode 125g) and the relay electrodes, while FIG. 14(b) (2) shows the change in the opposed area between the transmission electrode 125f (transmission electrode 125h) and the relay electrodes. Also, FIGS. 14(b) (3) to 14(b) (6) respectively show the change in the opposed area between another transmission electrode and the relay electrodes opposed to the transmission electrode.

Further, like the detection signal detected at the detection electrode 124a, the detection signal detected at the detection electrode 124e is a signal resulting from the high-frequency signal from the transmission electrode 125e and the inverted high-frequency signal from the transmission electrode 125h being superimposed on each other. The high-frequency signal is amplitude-modulated in accordance with the capacitance between the transmission electrode 125e and the relay electrode opposed to the transmission electrode 125e and subsequently amplitude-modulated in accordance with the capacitance between the relay electrode and the detection electrode 124e. Accordingly, the detection signal detected at the detection electrode 124e is amplitude-modulated by a value obtained by multiplying the opposed area (FIG. 14(b) (1)) between the transmission electrode 125e and the relay electrode by the opposed area (FIG. 14(b) (3)) between the relay electrode opposed to the transmission electrode 125e and the detection electrode 124e, and the inverted high-frequency signal is amplitude-modulated by a value obtained by multiplying the opposed area (FIG. 14(b) (2)) between the transmission electrode 125h and the relay electrode opposed to the transmission electrode 125h by the opposed area (FIG. 14(b) (4)) between the relay electrode and the detection electrode 124e. That is, the change in the opposed area of the detection electrode 124e to the transmission electrodes 125e, 125h becomes a triangular waveform shown in FIG. 14(b) (7), which results in that the detection signal detected at the detection electrode 124e is amplitude-modulated by the triangular waveform shown in FIG. 14(b) (7). It is noted that since the detection electrode 124g generates the same signal as the detection electrode 124a, the detection electrode 124a and the detection electrode 124g are coupled to input a phase B detection signal to the differential operational amplifier 129b. Similarly, the change in the opposed area of the detection electrode 124f to the transmission electrodes 125e, 125f becomes a triangular waveform shown in FIG. 14(b) (8), which results in that the detection signal detected at the detection electrode 124f is amplitude-modulated by the triangular waveform shown in FIG. 14(b) (8). It is noted that since the detection electrode 124h generates the same signal as the detection electrode 124f, the detection electrode 124e and the detection electrode 124h are coupled so that the signal is input as a phase /B detection signal to the differential operational amplifier 129b.

It is noted that since the capacitance between electrodes is actually defined not only by the area with which the electrodes are opposed directly (orthogonally) to each other, but also obliquely depending on the distance between the electrodes, the movement of a rotor having electrodes with smaller spacing therebetween causes the actual change in the capacitance between the electrodes not to be triangular but to be near sinusoidal. Accordingly, the voltage of the output signals Va, Vb output from the operational amplifiers 129a, 129b also shows a signal waveform amplitude-modulated by a sinusoidal waveform.

Figure 13:
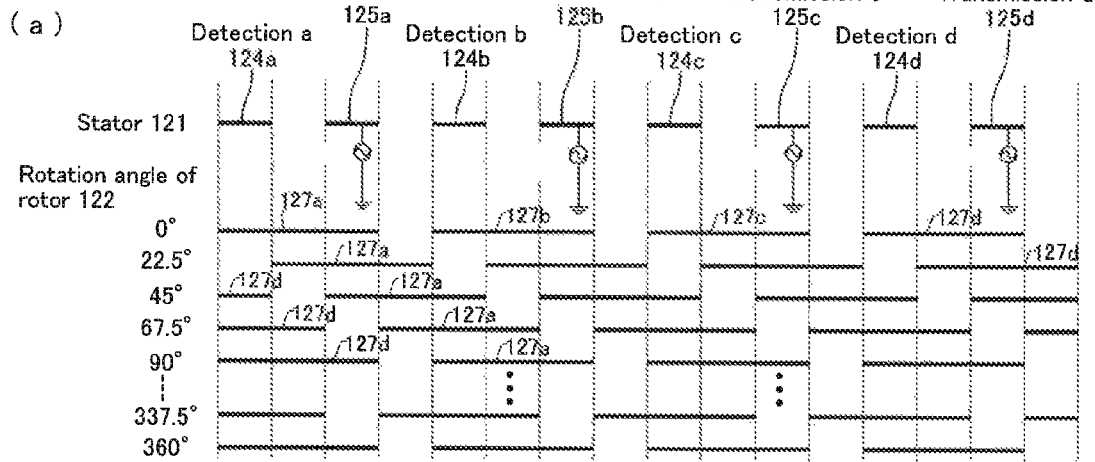
FIGS. 13(a) and 13(b) show a waveform diagram showing the change in the differential output (phase A system) based on the relative positional relationship between electrodes arranged on inner layers and the change in the opposed area with the rotation of the rotor.
Figure 13:
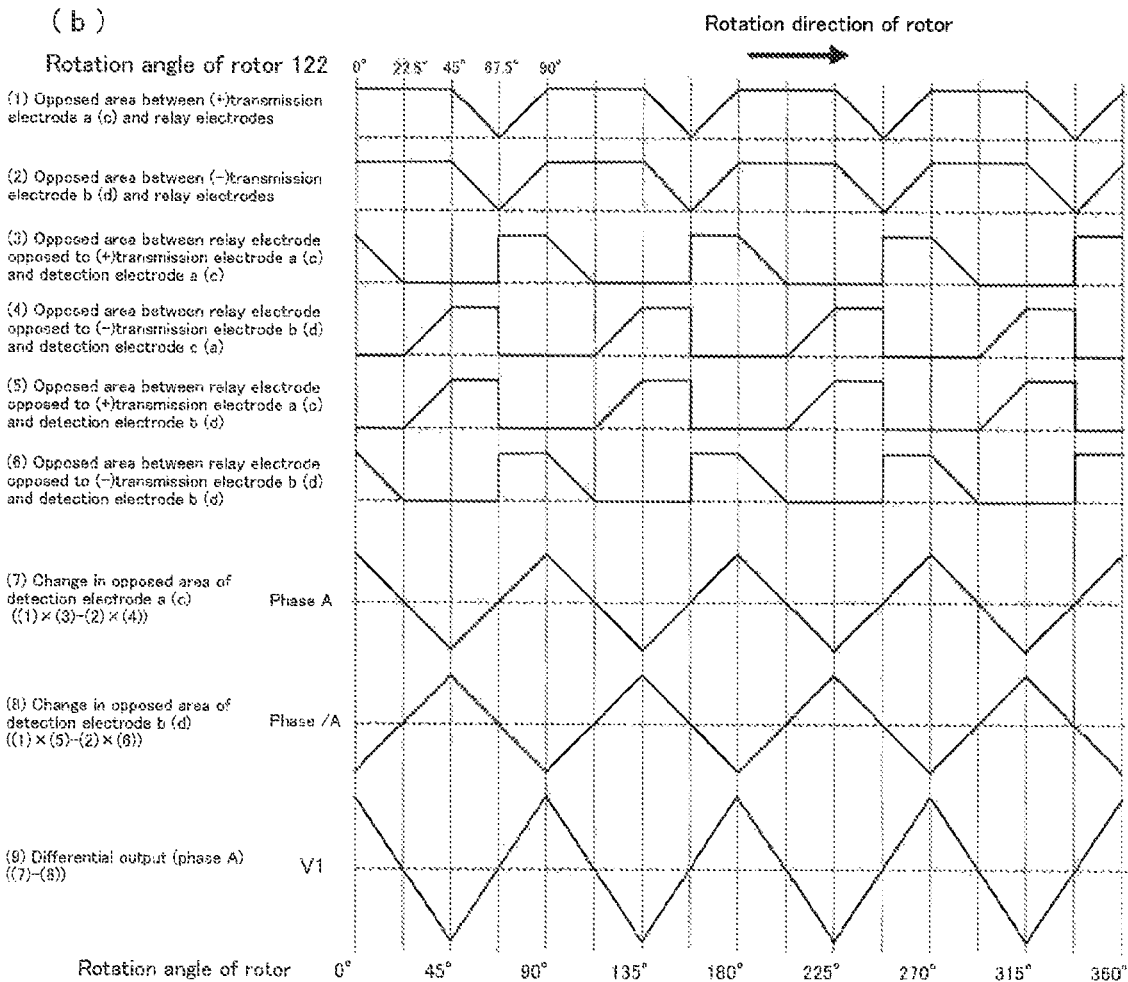
Figure 14:
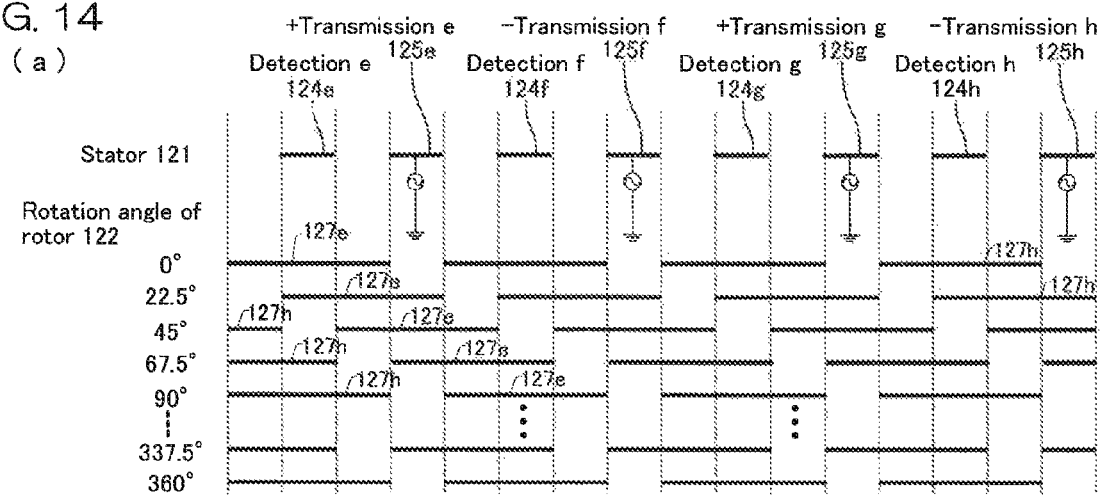
FIGS. 14(a) and 14(b) show a waveform diagram showing the change in the differential output (phase B system) based on the relative positional relationship between electrodes arranged on outer layers and the change in the opposed area with the rotation of the rotor.
Figure 14:
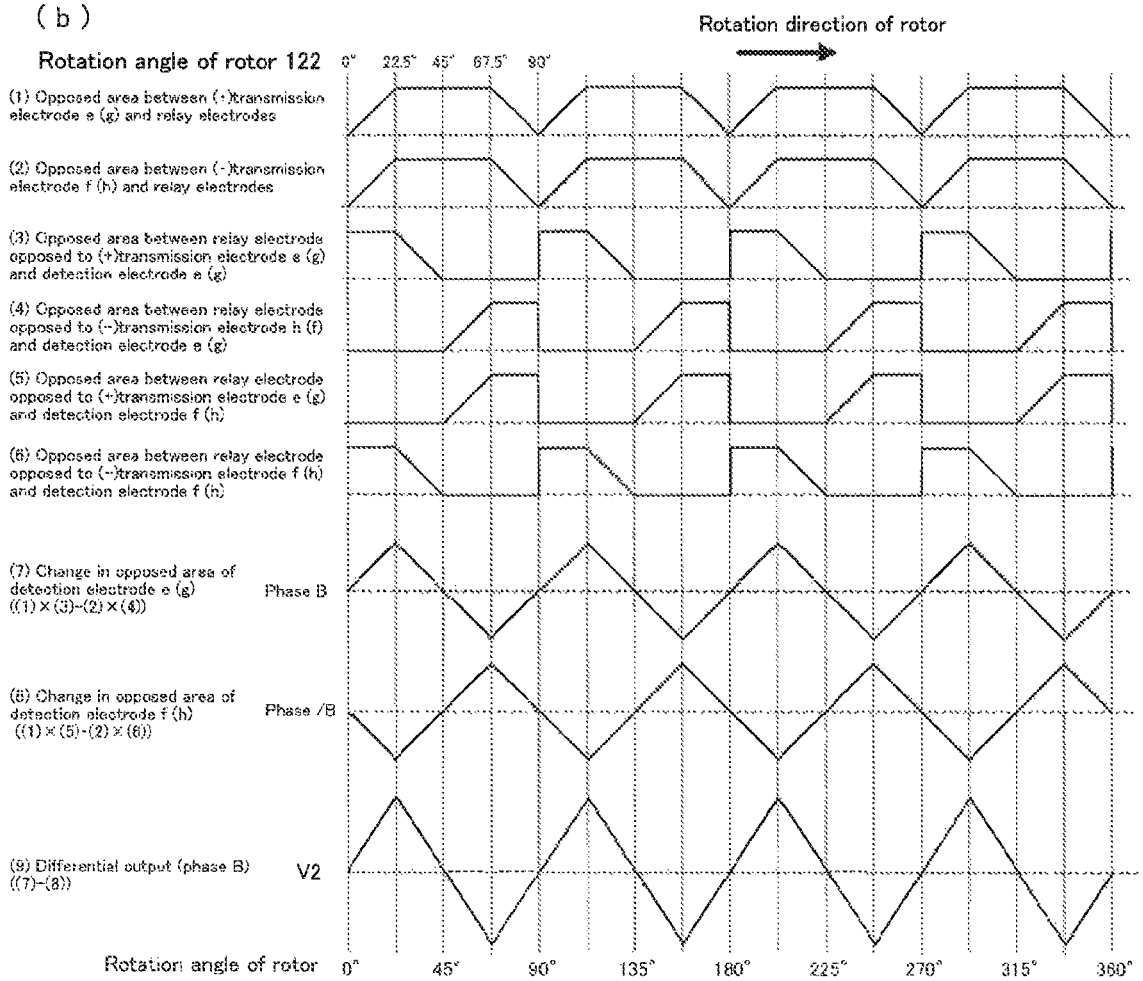

The output signals Va, Vb output from the operational amplifiers 129a, 129b are demodulated by a demodulator not shown, and the demodulator outputs modulated signals V1, V2 shown in FIG. 15. Since the modulated signals V1, V2 have a relative phase difference of 90 degrees, applying well-known resolver-digital (RD) conversion processing to the modulated signals V1, V2 allows obtaining the rotation angle of the rotor 122. Since the four relay electrodes 127a to 127d are arranged on the outer layer and the four relay electrodes 127e to 127h are arranged on the inner layer of the rotor 122, one revolution (by 360 degrees) of the rotor 122 causes the electrostatic encoder 121 to output four cycles of sinusoidal wave as shown in FIGS. 13 and 14.

As shown in FIG. 12, the electrostatic encoder according to the present embodiment thus includes the stator with the transmission electrodes and the detection electrodes arranged alternately thereon in the direction of rotation and the rotor arranged proximal to the stator, and the rotation angle of the rotor can be obtained from modulated signals of sinusoidal waveforms output with the rotation of the rotor and having a mutual phase difference of 90 degrees.

As described above, since the transmission electrodes and the detection electrodes are arranged alternately in the direction of rotation on the stator of the electrostatic encoder according to the present embodiment, modulated signals of sinusoidal waveforms having a mutual phase difference can be obtained from the detection signals detected at the detection electrodes with the rotation of the rotor with the relay electrodes arranged thereon. The rotation angle of the rotor can be obtained from the modulated signals of sinusoidal waveforms having a mutual phase difference. While the electrostatic encoders according to the above-described embodiments include a stator and a rotor, such a stator and a rotor may not necessarily be provided, but two elements may only be formed in a structure in which transmission electrodes and detection electrodes are arranged alternately on one of the elements in the direction of rotation, while relay electrodes are arranged on the other elements to obtain the relative rotation angle between the two elements. Further, the transmission electrodes, the detection electrodes, and the relay electrodes may be arranged linearly to obtain the linear travel distance.

REFERENCE SIGNS LIST 40, 70, 120: Electrostatic encoders
41, 71, 121: Stators
42, 72, 122: Rotors
44a to 44d, 74a to 74h, 124a to 124h: Detection electrodes
45a to 45d, 75a to 75h, 125a to 125h: Transmission electrodes
47a to 47e, 77a to 77j, 127a to 127h: Relay electrodes
48a, 78a, 128a: High-frequency signals
48b, 78b, 128b: Inverted high-frequency signals
49, 79a and 79b, 129a and 129b: Differential operational amplifiers
Va, Vb: Output signals
V1, V2: Modulated signals

The invention claimed is:
1. An electrostatic encoder that uses a capacitance defined by electrodes arranged on mutually opposed surfaces of a first insulation member and a second insulation member to measure a displacement of the first insulation member in a measurement direction, wherein:

the electrodes include:
- a plurality of relay electrodes arranged on the first insulation member at regular intervals of a predetermined first electrode cycle in the measurement direction; and
- a plurality of transmission electrodes and a plurality of detection electrodes arranged on the second insulation member at regular intervals of a predetermined second electrode cycle in the measurement direction, the plurality of transmission electrodes and the plurality of detection electrodes being arranged alternately in the measurement direction;

the first insulation member is a disk-shaped rotor and the second insulation member is a disk-shaped stator; and the predetermined second electrode cycle is set to a predetermined electrode cycle different from the predetermined first electrode cycle, and, when a high-frequency signal and an inverted high-frequency signal which is an inverted signal of the high-frequency signal are applied alternately in a circumferential direction to the plurality of transmission electrodes, detection signals detected at adjacent ones of the plurality of detection electrodes have a mutual phase difference of 90 degrees.

2. The electrostatic encoder according to claim 1, wherein a rotation angle of the disk-shaped rotor is obtained based on the detection signals detected at the adjacent ones of the plurality of detection electrodes and having the mutual phase difference of 90 degrees.

3. The electrostatic encoder according to claim 1, wherein the plurality of relay electrodes are formed in an approximately trapezoidal shape radiating from a center of the disk-shaped rotor, and the plurality of transmission electrodes and the plurality of detection electrodes are formed in an approximately trapezoidal shape radiating from a center of the disk-shaped stator.

4. An electrostatic encoder that uses a capacitance defined by electrodes arranged on mutually opposed surfaces of a first insulation member and a second insulation member to measure a displacement of the first insulation member in a measurement direction, wherein:

the electrodes include:
- a plurality of relay electrodes arranged on the first insulation member at regular intervals of a predetermined first electrode cycle in the measurement direction; and
- a plurality of transmission electrodes and a plurality of detection electrodes arranged on the second insulation member at regular intervals of a predetermined second electrode cycle in the measurement direction, the plurality of transmission electrodes and the plurality of detection electrodes being arranged alternately in the measurement direction;

the first insulation member is a disk-shaped rotor and the second insulation member is a disk-shaped stator; and when a number of the plurality of transmission electrodes and a number of the plurality of detection electrodes arranged on the disk-shaped stator are each 4 nm and a number of the plurality of relay electrodes arranged on the disk-shaped rotor is X, the following relationship is met:

$$X/4n = m \pm 0.25,$$

where "n" and "m" are natural numbers, equal to or larger than 1.

5. The electrostatic encoder according to claim 4, wherein a rotation angle of the disk-shaped rotor is obtained based on a detection signal detected at a first detection electrode of the plurality of detection electrodes and a detection signal detected at a second detection electrode of the plurality of detection electrodes located m-th away circumferentially from the first detection electrode.

6. An electrostatic encoder that uses a capacitance defined by electrodes arranged on mutually opposed surfaces of a disk-shaped rotor and a stator to measure a rotation angle of the disk-shaped rotor, wherein:

the electrodes include:
- a plurality of relay electrodes arranged on each outer layer of multiple outer layers of the disk-shaped rotor and each inner layer of multiple inner layers of the disk-shaped rotor that are formed circumferentially on the disk-shaped rotor at regular circumferential intervals; and
- a plurality of transmission electrodes and a plurality of detection electrodes arranged on multiple outer layers of the stator and multiple inner layers of the stator that are formed circumferentially on the stator at regular circumferential intervals, the plurality of transmission electrodes and the plurality of detection electrodes being arranged circumferentially and alternately; and ones of the plurality of transmission electrodes and the plurality of detection electrodes arranged on the multiple outer layers of the stator are arranged at a same electrode cycle as ones of the plurality of relay electrodes arranged on the multiple outer layers of the disk-shaped rotor, and ones of the plurality of transmission electrodes and the plurality of detection electrodes arranged on the multiple inner layers of the stator are arranged at a same electrode cycle as ones of the plurality of relay electrodes arranged on the multiple inner layers of the disk-shaped rotor.

7. An electrostatic encoder that uses a capacitance defined by electrodes arranged on mutually opposed surfaces of a disk-shaped rotor and a stator to measure a rotation angle of the disk-shaped rotor, wherein:

the electrodes include:
- a plurality of relay electrodes arranged on each outer layer of multiple outer layers of the disk-shaped rotor and each inner layer of multiple inner layers of the disk-shaped rotor that are formed circumferentially on the disk-shaped rotor at regular circumferential intervals; and
- a plurality of transmission electrodes and a plurality of detection electrodes arranged on multiple outer layers of the stator and multiple inner layers of the stator that are formed circumferentially on the stator at regular circumferential intervals, the plurality of transmission electrodes and the plurality of detection electrodes being arranged circumferentially and alternately; and when a high-frequency signal and an inverted high-frequency signal which is an inverted signal of the high-frequency signal are applied alternately in a circumferential direction to the plurality of transmission electrodes, detection signals are detected having a mutual phase difference of 90 degrees between ones of the plurality of detection electrodes on the multiple outer layers of the stator and ones of the plurality of detection electrodes on the multiple inner layers of the stator.

8. The electrostatic encoder according to claim 7, wherein ones of the plurality of transmission electrodes and the plurality of detection electrodes arranged on the multiple inner layers of the stator are arranged in a manner deviated by a predetermined circumferential angle with respect to ones of the plurality of transmission electrodes and the plurality of detection electrodes arranged on the multiple outer layers of the stator.

9. The electrostatic encoder according to claim 7, wherein the rotation angle of the disk-shaped rotor is obtained based on the detection signals detected at the ones of the plurality of detection electrodes on the multiple outer layers of the stator and the ones of the plurality of detection electrodes on the multiple inner layers of the stator and having a mutual phase difference of 90 degrees.

* * * * *